United States Patent
Che et al.

(10) Patent No.: US 10,851,127 B2
(45) Date of Patent: Dec. 1, 2020

(54) PLATINUM COMPLEXES AND APPARATUSES THEREOF

(71) Applicant: The University of Hong Kong, Hong Kong (CN)

(72) Inventors: Chi Ming Che, Hong Kong (CN); Chun Lam Kwong, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 291 days.

(21) Appl. No.: 15/914,622

(22) Filed: Mar. 7, 2018

(65) Prior Publication Data

US 2018/0258119 A1    Sep. 13, 2018

Related U.S. Application Data

(60) Provisional application No. 62/468,191, filed on Mar. 7, 2017.

(51) Int. Cl.
| | |
|---|---|
| *C07F 15/00* | (2006.01) |
| *C09K 11/06* | (2006.01) |
| *H01L 51/00* | (2006.01) |
| *H01L 51/52* | (2006.01) |
| *H01L 51/44* | (2006.01) |
| *H01L 51/50* | (2006.01) |

(52) U.S. Cl.
CPC .......... *C07F 15/0093* (2013.01); *C09K 11/06* (2013.01); *H01L 51/0087* (2013.01); *H01L 51/441* (2013.01); *H01L 51/5024* (2013.01); *H01L 51/5203* (2013.01); *C09K 2211/1029* (2013.01); *C09K 2211/185* (2013.01); *H01L 51/0042* (2013.01); *H01L 51/5016* (2013.01); *H01L 2251/5384* (2013.01)

(58) Field of Classification Search
CPC .................................................. C07F 15/0093
See application file for complete search history.

(56) References Cited

FOREIGN PATENT DOCUMENTS

JP    2010135689 A  *  6/2010

OTHER PUBLICATIONS

English machine translation of JP-2010135689-A (Year: 2010).*
Ma, Y., et al., Electroluminescence from triplet metal-ligand charge-transfer excited state of transition metal complexes, Synthetic Metals, 1998, 94:245-248, Elsevier Science S.A.

(Continued)

*Primary Examiner* — Peter F Godenschwager
(74) *Attorney, Agent, or Firm* — Saliwanchik, Lloyd & Eisenschenk

(57) ABSTRACT

Provided herein are platinum complexes of Formula I:

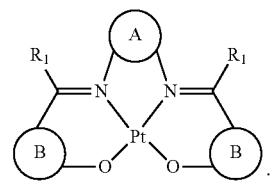

Formula I

Also, provided are methods of making the platinum complexes of Formula I and apparatuses that include platinum complexes of Formula I. The apparatuses can include near infrared organic light emitting devices.

13 Claims, 3 Drawing Sheets

(56) References Cited

OTHER PUBLICATIONS

Baldo, M. A., et al., Highly efficient phosphorescent emission from organic electroluminescent devices, Nature, Sep. 10, 1998, 395:151-154, Macmillan Publishers Ltd.
Sun, R. G., et al., 1.54 μm infrared photoluminescence and electroluminescence from an erbium organic compound, Journal of Applied Physics, May 15, 2000, 87(10):7589-7591, AIP Publishing, American Institute of Physics.
Schanze, K. S., et al., Near-infrared organic light emitting diodes, Synthetic Metals, 2003, 137:1013-1014, Elsevier Science B.V.
Kang, T.-S., et al., Near-Infrared Electroluminescence from Lanthanide Tetraphenylporphyrin:Polystyrene Blends, Advanced Materials, Jul. 4, 2003, 15(13):1093-1097, Wiley-VCH Verlag GmbH & Co. KGaA, Weinheim.
O'Riordan, A., et al., Near infrared electroluminescence from neodymium complex-doped polymer light emitting diodes, Thin Solid Films, 2006, 497:299-303, Elsevier B.V.

* cited by examiner

PLATINUM COMPLEXES AND APPARATUSES THEREOF

CROSS-REFERENCE TO RELATED APPLICATION

This application claims the priority benefit of U.S. Provisional Application Ser. No. 62/468,191, filed Mar. 7, 2017, which is hereby incorporated by reference in its entirety.

FIELD OF THE INVENTION

The present disclosure generally relates to platinum complexes and their use in electronic devices, such as near infrared organic light emitting devices (NIR-OLED).

BACKGROUND OF THE INVENTION

Near infrared emitters can have applications in various fields, such as telecommunications, night-vision, bio-imaging, and sensors. Light emitting electronic components using organic materials can offer benefits, such as low weight, low power consumption and flexibility when compared to inorganic light emitting electronic components. Additionally, soluble organic materials can allow for the use of solution processing in device manufacturing, leading to more robust manufacturing options. Many efforts have been undertaken to develop organic materials that emit light in the visible spectrum. See, e.g., Y Ma, H. Zhang, J. Shen, & C.-M. Che, *Electroluminescence from triplet metal-ligand charge-transfer excited state of transition metal complexes*, 94 SYNTH. MET. 245 (1998); M. A. Baldo, D. F. O'Brien, Y You, A. Shoustikov, S. Sibley, M. E. Thompson & S. R. Forrest, *Highly efficient phosphorescent emission from organic electroluminescent devices*, 395 NATURE, 151 (1998). Currently, highly efficient phosphorescence materials that emit light in the visible spectrum have been synthesized and investigated, while near-infrared ("NIR") implementations have not had significant advancements. For such organic materials, the energy gap law indicates that the emission quantum yield will decrease upon the decrease in band gap due to the enhancement of non-radiative decay.

Early attempts at the development of organic NIR emitters utilized lanthanide-based metal complexes. See, e.g., R. G. Sun, Y Z. Wang, Q. B. Zheng, H. J. Zhang & A. J. Epstein, *1.54 μm infrared photoluminescence and electroluminescence from an erbium organic compound*, 87 J. APPL. PHYS., 7589-7591 (2000); K. S. Schanze, J. R. Reynolds, J. M. Boncella, B. S. Harrison, T. J. Foley, M. Bouguettaya & T.-S. Kang, *Near-infraredorganic light emitting diodes*, 137 SYNTH. MET. 1013-1014 (2003); T. S. Kang, B. S. Harrison, T. J. Foley, A. S. Knefely, J. M. Boncella, J. R. Reynolds & K. S. Schanze, *Near-nfrared Electroluminescence from Lanthanide Tetraphenylporphyrin: Polystyrene Blends*, 15 ADV. MAT. 1093-1097 (2003); A. O'Riordan, E. O'Connor, S. Moynihan, P. Nockemann, P. Fias, R. Van Deun, D. Cupertino, P. Mackie & G. Redmond, *Near infrared electroluminescence from neodymium complex-doped polymer light emitting diodes*, 497 THIN SOLID FILMS 299-303 (2006). For example, Sun et. al. used doped erbium(III) tris(acetylacetonato)(1,10-phenanthroline) [Er(acac)$_3$(phen)] in a polyvinylcarbazole (PVK) based device having an electroluminescence peak intensity at 1540 nm. And, Schanze et. al. describes the synthesis of a series of lanthanide porphyrin derivatives with different metal centers and auxiliary ligands. From these studies, lanthanide-based metal complexes were found to have emission maxima of 977 nm, 1197 nm, and 1570 nm with ytterbium, holmium and erbium, respectively, while the emission maxima were almost independent from that of the ligands. See id. The emission spectra obtained had narrow bandwidths, and it was concluded that the emission was originated from f-centered transition. See id.

Despite this success in demonstrating the capability of organic materials as NIR emitters, the lanthanide emitters suffer from drawbacks. For example, the excited state has minor ligand character and, therefore, it is difficult to tune the emission by means of ligand modification. Moreover, the nature of f-centered transitions for centrosymmetric complexes render low emission quantum yield. In Schanze et. al., the external quantum efficiency (EQE) and maximum irradiance of the electroluminescence device fabricated with ytterbium porphyrin complexes are only 0.0008% and 0.0006 mW cm$^{-2}$, respectively. In Redmond et. al., utilizing neodymium(III) tri(9-hydroxyphenalen-1-one) as an emitter, also results in a NIR electroluminescence device with low efficiency, where the EQE and maximum irradiance were 0.007% and 0.00085 mW cm$^{-2}$ respectively. Thompson describes a NIR electroluminescence device with an improved EQE and a maximum irradiance of 8.5% and 1.21 mWcm$^{-2}$, respectively. A platinum(II) porphyrin derivative with extended π-conjugation, namely platinum(II) tetraphenyltetrabenzoporphyrin [Pt(tptbp)] was used as the NIR emitter and the emission maximum was at 765 nm. However, the long excited state lifetime (53 μs) of Pt(tptbp) would have a detrimental effect on device performance due to the saturation of excited state emitter in the active layer. See id. Furthermore, the production of metalloporphyin requires a sophisticated synthetic process that is difficult to scale up for industrial applications.

Therefore, there is a need for new platinum complexes that emit light in the near infrared wavelengths and can be used in making organic light emitting devices.

SUMMARY OF INVENTION

Disclosed herein are platinum complexes, methods of making the platinum complexes, and apparatuses that use the platinum complexes. In one specific embodiment, the platinum complexes can include complexes of Formula I:

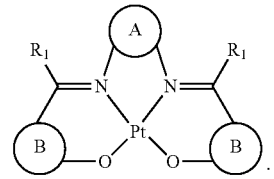

Formula I

In another specific embodiment, the apparatus can include a platinum complex of Formula I.

In another specific embodiment, the method of making a platinum complex can include: reacting a starting material with n-BuLi using diethyl ether as a first solvent to yield a first intermediate product; reacting the first intermediate product with a second solvent to yield a second intermediate product; and reacting the second intermediate product with a platinum salt in the presence of a third solvent to make the platinum complex, wherein the platinum complex comprises a Formula I.

BRIEF DESCRIPTION OF THE DRAWING FIGURES

In the following detailed description, reference is made to the accompanying figures, depicting exemplary, non-limiting and non-exhaustive embodiments of the invention. So that the manner in which the above recited features of the present invention can be understood in detail, a more particular description of the invention, briefly summarized above, can be had by reference to the embodiments, some of which are illustrated in the appended figures. It should be noted, however, that the appended figures illustrate only typical embodiments of this invention and are therefore not to be considered limiting of its scope, for the invention can admit to other equally effective embodiments.

DETAILED DESCRIPTION OF THE INVENTION

Figure 1:
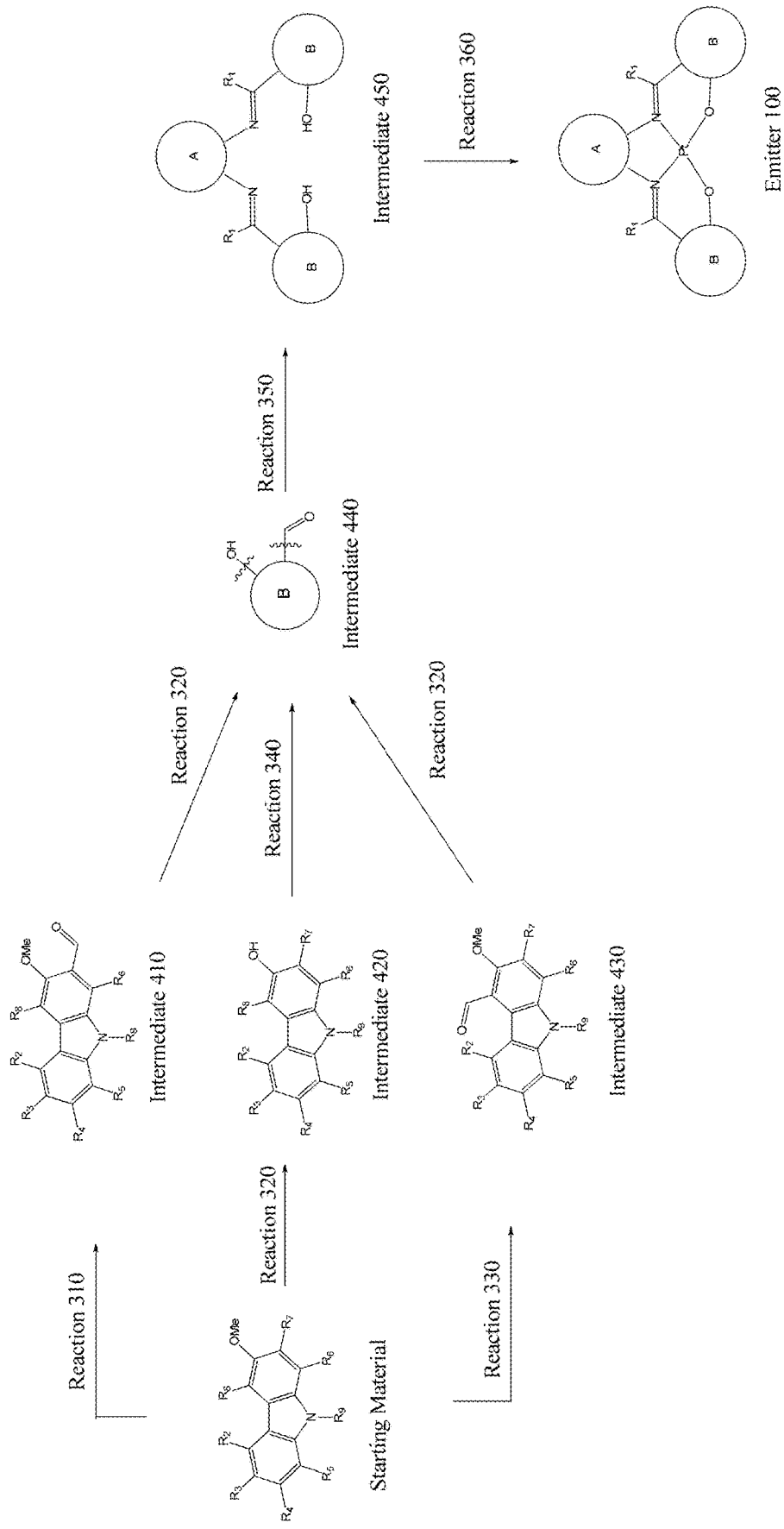
FIG. 1 shows a method of making the platinum complexes.

The platinum complexes can include characteristics and properties that allow for the emission of light in the near infrared range of the electromagnetic spectrum (700-1400 nm). For example, many of the platinum complexes having carbazole groups ($C_{13}H_9N$), have electromagnetic emissions in the NIR region (700-1100 nm). Also, the platinum complexes can exhibit thermal stability suitable for NIR-OLED fabrication.

The platinum complexes can include, but are not limited to, compounds of Formula I:

Formula I

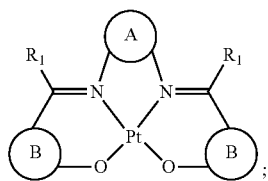

where A is selected from an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene, acyl-substituted heterocyclic arene,

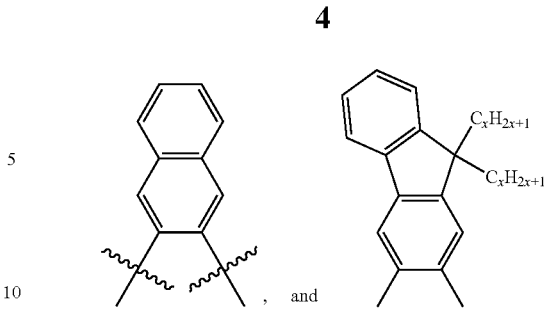

where x is 1 to 20;

where B is selected from a carbazole, alkyl N-substituted carbazole, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole, acyl-substituted N-substituted carbazole group,

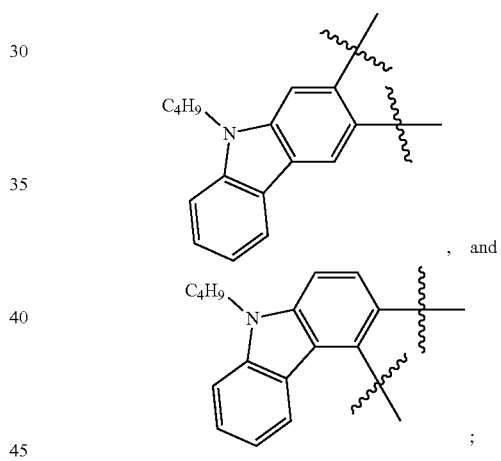

and where $R_1$ is selected from a hydrogen, halogen, hydroxyl, an unsubstituted alkyl, a substituted alkyl, alkenyl, alkynyl, cycloalkyl, heterocyclyl, unsubstituted aryl, substituted aryl, acyl, alkoxy, alkyloxy, aryloxy, acyloxy, amino, aminoalkyl, nitro, acylamino, aralkyl, cyano, carboxyl, thio, styryl, aminocarbonyl, carbamoyl, aryloxycarbonyl, phenoxycarbonyl, or an alkoxycarbonyl group. For example, $R_1$ can include, but is not limited to: hydrogen, halogen, hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thiol, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, or an alkoxycarbonyl group containing from 1 to 20 carbon atoms.

As used herein, the term "alkyl" includes saturated aliphatic hydrocarbons including straight chains and branched chains. In some embodiments, the alkyl group has 1 to 20 carbon atoms, 1 to 10 carbon atoms, 1 to 6 carbon atoms, or 1 to 4 carbon atoms. For example, the term "$C_{1-6}$ alkyl," as well as the alkyl moieties of other groups referred to herein (e.g., $C_{1-6}$ alkoxy) refers to linear or branched radicals of 1 to 6 carbon atoms (e.g., methyl, ethyl, n-propyl, isopropyl, n-butyl, isobutyl, sec-butyl, tert-butyl, n-pentyl, or n-hexyl). For yet another example, the term "$C_{1-4}$ alkyl" refers to linear or branched aliphatic hydrocarbon chains of 1 to 4 carbon atoms; the term "$C_{1-3}$ alkyl" refers to linear or branched aliphatic hydrocarbon chains of 1 to 3 carbon atoms; the term "$C_{1-2}$ alkyl" refers to linear or branched aliphatic hydrocarbon chains of 1 to 2 carbon atoms; and the term "$C_1$ alkyl" refers to methyl. The term "lower alkyl" refers to linear or branched radicals of 1 to 6 carbon atoms. An alkyl group optionally can be substituted by one or more (e.g. 1 to 5) suitable substituents.

As used herein, the term "alkenyl" includes aliphatic hydrocarbons having at least one carbon carbon double bond, including straight chains and branched chains having at least one carbon-carbon double bond. In some embodiments, the alkenyl group has 2 to 20 carbon atoms, 2 to 10 carbon atoms, 2 to 6 carbon atoms, 3 to 6 carbon atoms, or 2 to 4 carbon atoms. For example, as used herein, the term "$C_{2-6}$ alkenyl" means straight or branched chain unsaturated radicals (having at least one carbon-carbon double bond) of 2 to 6 carbon atoms, including, but not limited to, ethenyl, 1-propenyl, 2-propenyl (allyl), isopropenyl, 2-methyl-1-propenyl, 1-butenyl, 2-butenyl, and the like. An alkenyl group optionally can be substituted by one or more (e.g. 1 to 5) suitable substituents. When the compounds contain an alkenyl group, the alkenyl group may exist as the pure E form, the pure Z form, or any mixture thereof.

As used herein, the term "alkynyl" includes aliphatic hydrocarbons having at least one carbon-carbon triple bond, including straight chains and branched chains having at least one carbon carbon triple bond. In some embodiments, the alkynyl group has 2 to 20, 2 to 10, 2 to 6, or 3 to 6 carbon atoms. For example, as used herein, the term "$C_{2-6}$ alkynyl" refers to straight or branched hydrocarbon chain alkynyl radicals as defined above, having 2 to 6 carbon atoms. An alkynyl group optionally can be substituted by one or more (e.g. 1 to 5) suitable substituents.

As used herein, the term "cycloalkyl" includes saturated or unsaturated, non-aromatic, monocyclic or polycyclic (such as bicyclic) hydrocarbon rings (e.g., monocyclics such as cyclopropyl, cyclobutyl, cyclopentyl, cyclohexyl, cycloheptyl, cyclooctyl, cyclononyl, or bicyclics including spiro, fused, or bridged systems (such as bicyclo[1.1.1]pentanyl, bicyclo[2.2.1]heptanyl, bicyclo[3.2.1]octanyl or bicyclo[5.2.0]nonanyl, decahydronaphthalenyl, etc.). The cycloalkyl group has 3 to 15 carbon atoms. In some embodiments the cycloalkyl may optionally contain one, two or more noncumulative non-aromatic double or triple bonds and/or one to three oxo groups. In some embodiments, the bicycloalkyl group has 6 to 14 carbon atoms. For example, the term "$C_{3-14}$ cycloalkyl" includes saturated or unsaturated, non-aromatic, monocyclic or polycyclic (such as bicyclic) hydrocarbon rings of 3 to 14 ring-forming carbon atoms (e.g., cyclopropyl, cyclobutyl, cyclopentyl, cyclohexyl, bicyclo[1.1.1]pentanyl, or cyclodecanyl); and the term "$C_{3-7}$ cycloalkyl" includes saturated or unsaturated, nonaromatic, monocyclic or polycyclic (such as bicyclic) hydrocarbon rings of 3 to 7 ring forming carbon atoms (e.g., cyclopropyl, cyclobutyl, cyclopentyl, cyclohexyl, bicyclo[1.1.1]pentan-1-yl, or bicyclo[1.1.1]pentan-2-yl). For another example, the term "$C_{3-6}$ cycloalkyl" includes saturated or unsaturated, non-aromatic, monocyclic or polycyclic (such as bicyclic) hydrocarbon rings of 3 to 6 ring-forming carbon atoms. For yet another example, the term "$C_{3-4}$ cycloalkyl" refers to cyclopropyl or cyclobutyl. Also included in the term "cycloalkyl" are moieties that have one or more aromatic rings (including aryl and heteroaryl) fused to the cycloalkyl ring, for example, benzo or thienyl derivatives of cyclopentane, cyclopentene, cyclohexane, and the like (e.g., 2,3-dihydro-1H-indene-1-yl, or 1H-inden-2(3H)-one-1-yl). The cycloalkyl group optionally can be substituted by 1 or more (e.g., 1 to 5) suitable substituents.

As used herein, the term "aryl" can include all-carbon monocyclic or fused-ring polycyclic aromatic groups having a conjugated pi-electron system. The aryl group has 6 or 10 carbon atoms in the ring(s). Most commonly, the aryl group has 6 carbon atoms in the ring. For example, as used herein, the term "$C_{6-10}$ aryl" means aromatic radicals containing from 6 to 10 carbon atoms such as phenyl and naphthyl. The aryl group optionally can be substituted by 1 or more (e.g., 1 to 5) suitable substituents. The term "arylene" refers to a divalent aryl moiety.

As used herein, the term "heteroaryl" includes monocyclic or fused-ring polycyclic aromatic heterocyclic groups with one or more heteroatom ring members (ring forming atoms) each independently selected from O, S and N in at least one ring. The heteroaryl group has 5 to 14 ring forming atoms, including 1 to 13 carbon atoms, and 1 to 8 heteroatoms selected from 0, S, and N. In some embodiments, the heteroaryl group has 5 to 10 ring-forming atoms including one to four heteroatoms. The heteroaryl group can also contain one to three oxo or thiono (i.e. =S) groups. In some embodiments, the heteroaryl group has 5 to 8 ring forming atoms including one, two or three heteroatoms. For example, the term "5-membered heteroaryl" refers to a monocyclic heteroaryl group as defined above with 5 ring-forming atoms in the monocyclic heteroaryl ring; the term "6-membered heteroaryl" includes to a monocyclic heteroaryl group as defined above with 6 ring-forming atoms in the monocyclic heteroaryl ring; and the term "5- or 6-membered heteroaryl" includes a monocyclic heteroaryl group as defined above with 5 or 6 ring-forming atoms in the monocyclic heteroaryl ring. For another example, term "5- to 10-membered heteroaryl" includes a monocyclic or bicyclic heteroaryl group as defined above with 5, 6, 7, 8, 9 or 10 ring-forming atoms in the monocyclic or bicyclic heteroaryl ring. A heteroaryl group optionally can be substituted by 1 or more (e.g., 1 to 5) suitable substituents. Examples of monocyclic heteroaryls include those with 5 ring-forming atoms including one to three heteroatoms or those with 6 ring-forming atoms including one, two or three nitrogen heteroatoms. Examples of fused bicyclic heteroaryls include two fused 5- and/or 6-membered monocyclic rings including one to four heteroatoms.

As used herein, the term "heterocyclyl" includes saturated and partially saturated heteroatom-containing ring-shaped radicals having from 5 through 15 ring members selected from carbon, nitrogen, sulfur and oxygen, wherein at least one ring atom is a heteroatom. Heterocyclyl radicals may contain one, two or three rings wherein such rings may be attached in a pendant manner or may be fused. Examples of saturated heterocyclic radicals include saturated 3 to 6-membered heteromonocylic group containing 1 to 4 nitrogen atoms [e.g. pyrrolidinyl, imidazolidinyl, piperidino, piperazinyl, etc.]; saturated 3 to 6-membered heteromonocyclic group containing 1 to 2 oxygen atoms and 1 to 3 nitrogen atoms [e.g. morpholinyl, etc.]; saturated 3 to 6-membered heteromonocyclic group containing 1 to 2 sulfur atoms and 1 to 3 nitrogen atoms [e.g., thiazolidinyl, etc.]. Examples of partially saturated heterocyclyl radicals include dihydrothiophene, dihydropyran, dihydrofuran and dihydrothiazole. Non-limiting examples of heterocyclic radicals include 2-pyrrolinyl, 3-pyrrolinyl, pyrrolindinyl, 1,3-dioxolanyl, 2H-pyranyl, 4H-pyranyl, piperidinyl, 1,4-dioxanyl, morpholinyl, 1,4-dithianyl, thiomorpholinyl, and the like.

As used herein, the term "alkoxy" or "alkyloxy" includes an —O-alkyl group. For example, the term "$C_{1-6}$ alkoxy" or "$C_{1-6}$ alkyloxy" includes an —O—($C_{1-6}$ alkyl) group; and the term "$C_{1-4}$ alkoxy" or "$C_{1-4}$ alkyloxy" can include an —O—($C_{1-4}$ alkyl) group. For another example, the term "$C_{1-2}$ alkoxy" or "$C_{1-2}$ alkyloxy" refers to an —O—($C_{1-2}$ alkyl) group. Examples of alkoxy include methoxy, ethoxy, propoxy (e.g., n-propoxy and isopropoxy), tert-butoxy, and the like. The alkoxy or alkyloxy group optionally can be substituted by 1 or more (e.g., 1 to 5) suitable substituents.

As used here, the term "aryloxy" includes an —O-aryl group. An example of a $C_{6-10}$ aryloxy group is —O-phenyl [i.e., phenoxy]. The —O-aryl group optionally can be substituted by 1 or more (e.g., 1 to 5) suitable substituents.

As used herein, the term "aminoalkyl" includes linear and/or branched alkyl radicals having one to about ten carbon atoms any one of which may be substituted with one or more amino radicals. Examples of such radicals include aminomethyl, aminoethyl, aminopropyl, aminobutyl and aminohexyl.

As used herein, the term "optionally substituted" means that substitution is optional and therefore includes both unsubstituted and substituted atoms and moieties. A "substituted" atom or moiety indicates that any hydrogen on the designated atom or moiety can be replaced with a selection from the indicated substituent group (up to that every hydrogen atom on the designated atom or moiety is replaced with a selection from the indicated substituent group), provided that the normal valence of the designated atom or moiety is not exceeded, and that the substitution results in a stable compound. For example, if a methyl group (i.e., $CH_3$) is optionally substituted, then up to 3 hydrogen atoms on the carbon atom can be replaced with substituent groups.

The platinum complexes can include, but are not limited to, emitter compounds. For example, the platinum complexes can include, but are not limited to:

Emitter 101

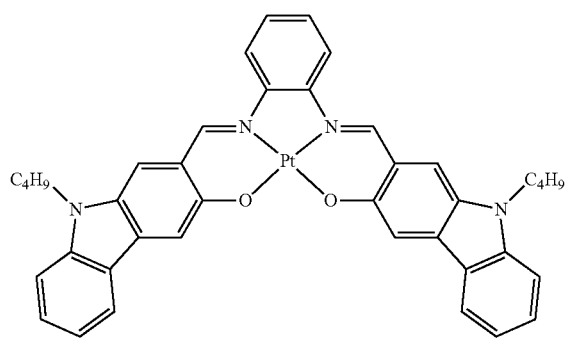

Emitter 102

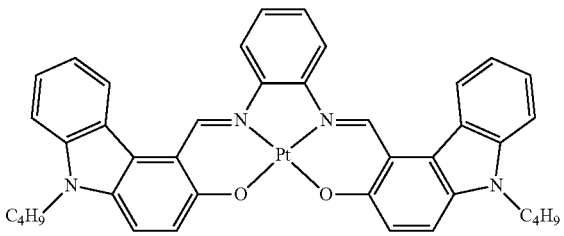

Emitter 103

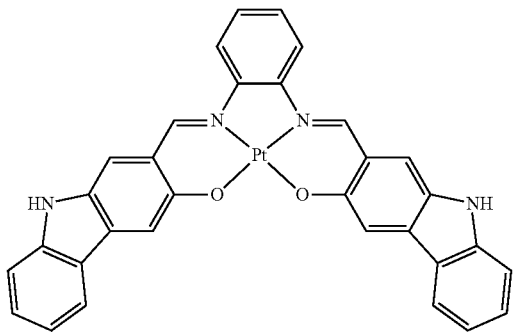

Emitter 104

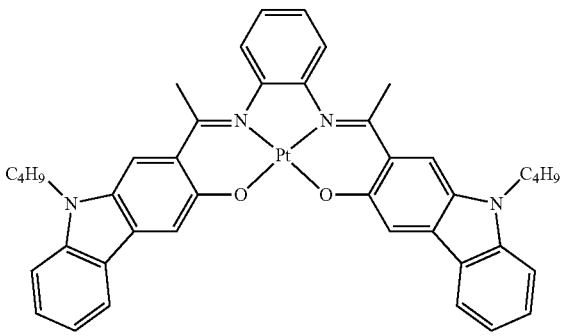

Emitter 105

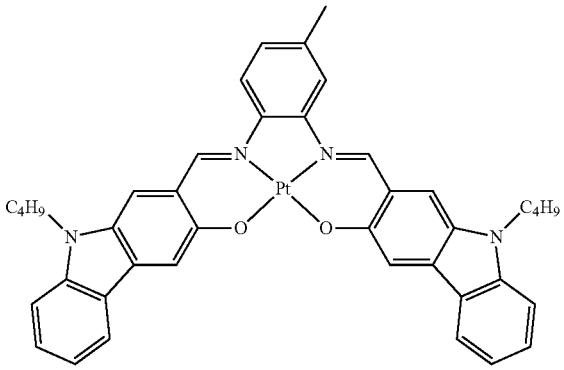

Emitter 106
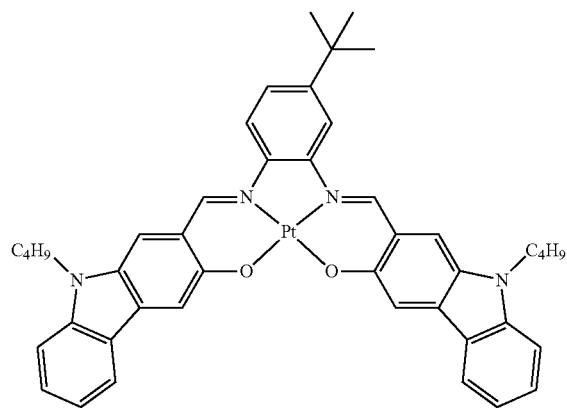
Emitter 107
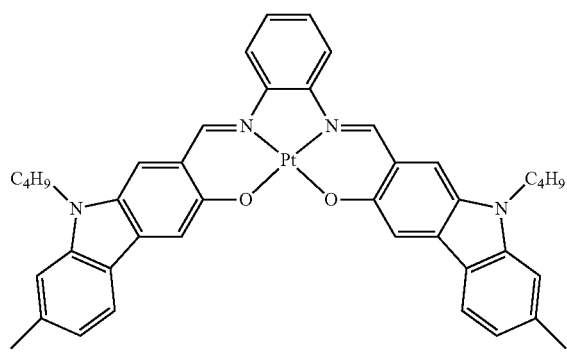
Emitter 108
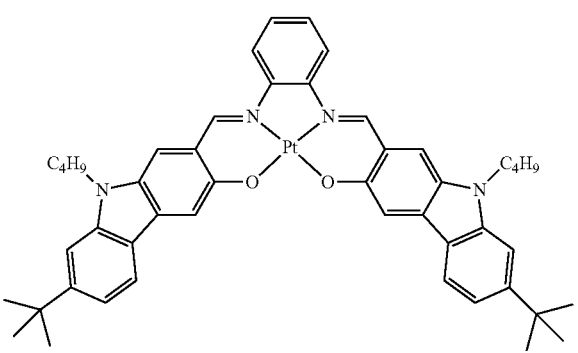
Emitter 109
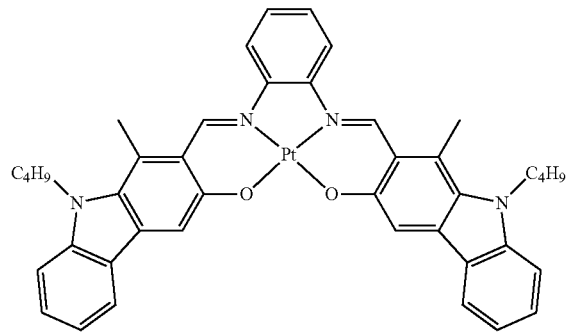
Emitter 110
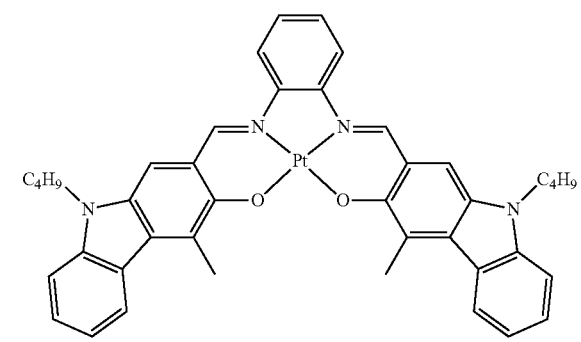
Emitter 111
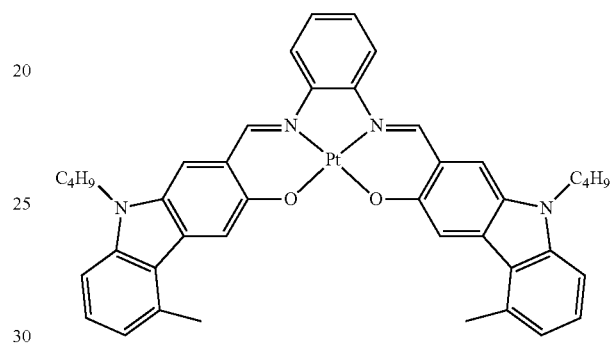
Emitter 112
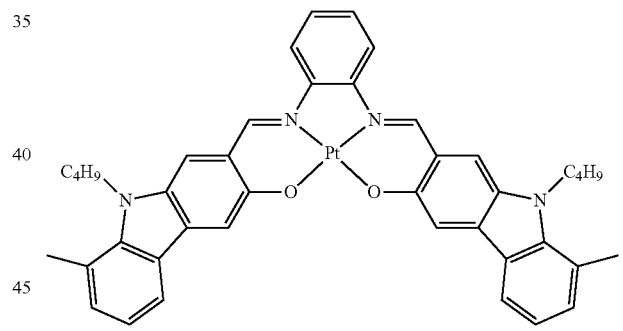
Emitter 113
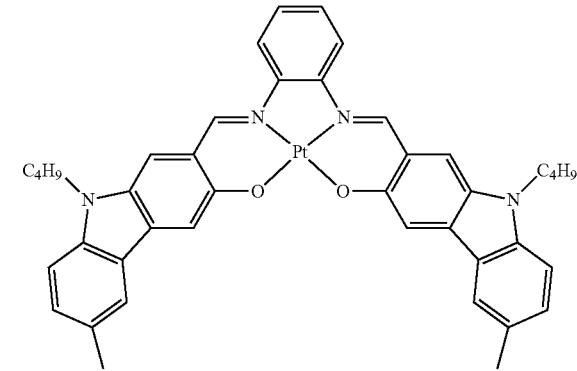

Emitter 114
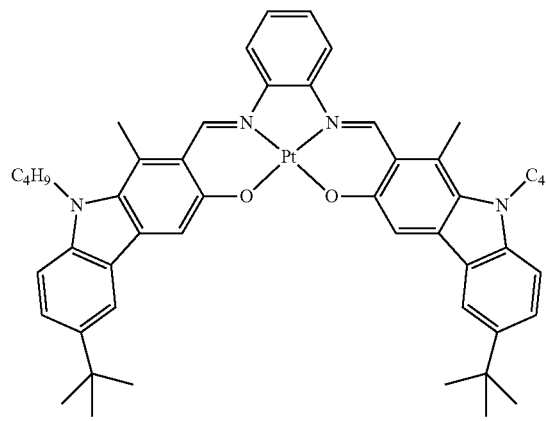
Emitter 117
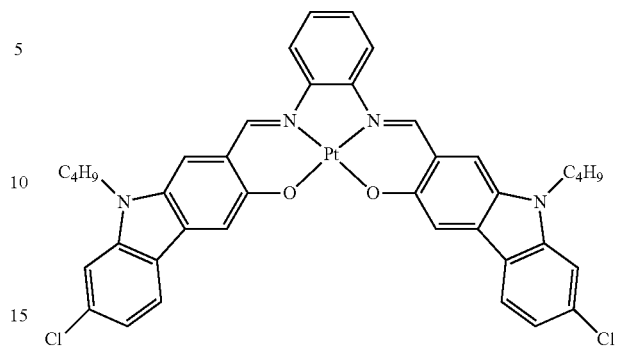
Emitter 115
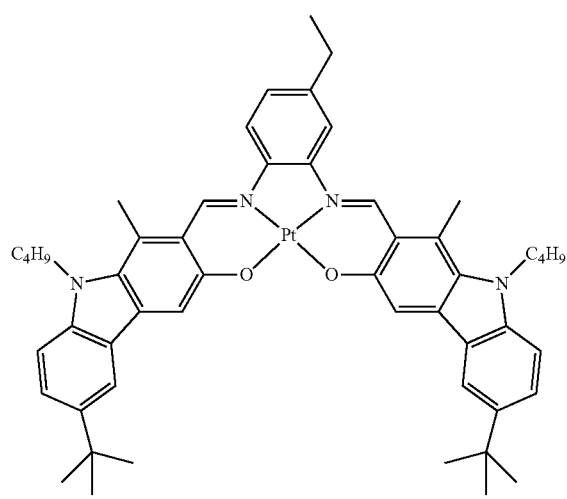
Emitter 118
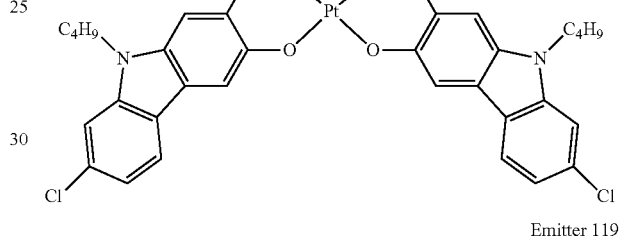
Emitter 119
Emitter 116
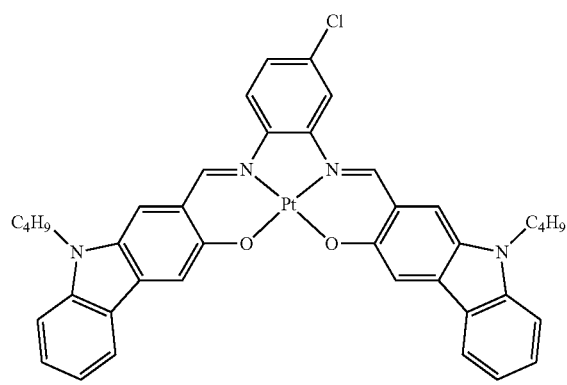
Emitter 120
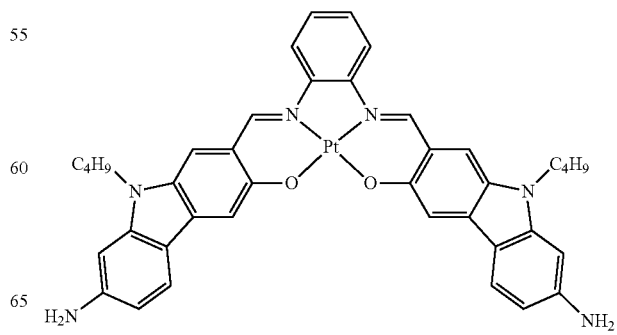

Emitter 121

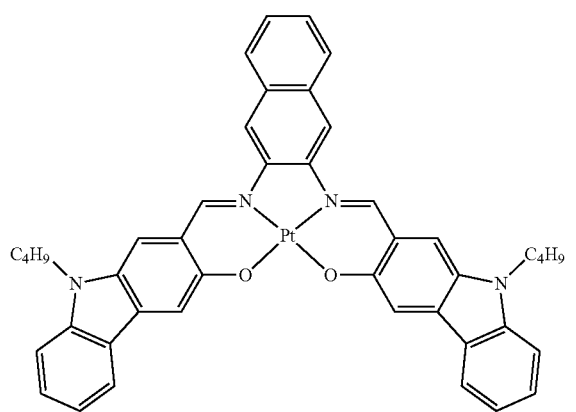

Emitter 122

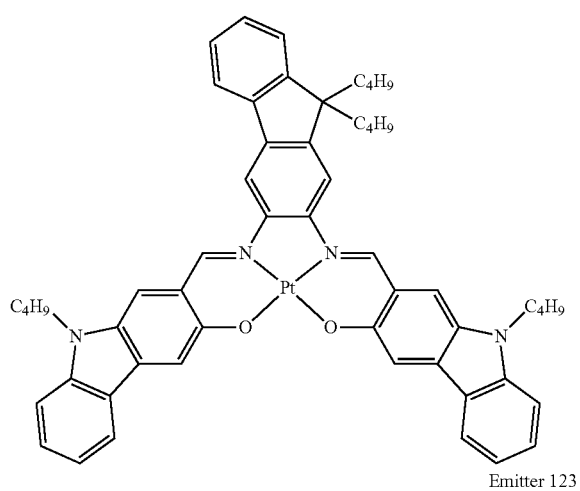

Emitter 123

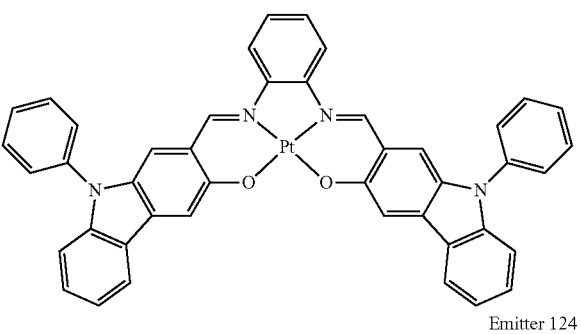

Emitter 124

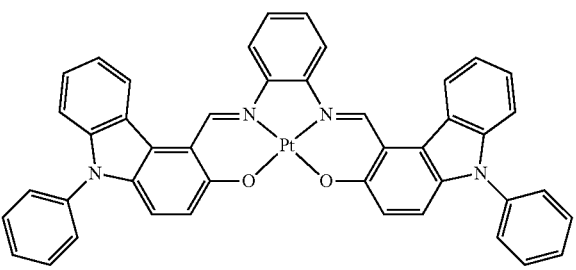

The light emission of the platinum complexes can vary widely. For example, the platinum complexes can have a light emission from a low of about 700 nm, about 800 nm, or about 900 nm, to a high of about 1400 nm, about 1500 nm, or about 1600 nm. In an another example, platinum complexes can have a light emission greater than 800 nm, greater than 900 nm, greater than 1000 nm, or greater than 1100 nm. In an another example, the platinum complexes can have a light emission from about 700 nm to about 750 nm, about 750 nm to about 800 nm, about 800 nm to about 900 nm, about 850 nm to about 900 nm, about 950 nm to about 1000 nm, about 950 nm to about 1050 nm, about 1000 nm to about 1050 about 1000 nm to about 1100 nm, about 1100 nm to about 1200 nm, about 1200 nm to about 1300 nm, about 1300 nm to about 1400 nm, about 1400 nm to about 1500 nm, about 1500 nm to about 1600 nm. The choice of ligands for the platinum complexes can alter emissive properties widely, For example, when B is a group other than carbazole, such as aryl groups that have similar π-conjugation, the near infrared emission can be significantly degraded.

The platinum complexes can include, but are not limited to, platinum in a +4, +3, +2, +1, 0, −1, −2, and −3 oxidation state. The platinum complexes can include, but are not limited, square planar geometry around the platinum center. For example, Emitter 101 has platinum in a +2 oxidation state, and a square planar geometry with the coordination sites occupied by a tetradentate ligand. The tetradentate ligand coordinates to the platinum center through two metal-oxygen bonds and two metal-nitrogen bonds.

The method of making the platinum complexes, can include but is not limited to: reacting a starting material with n-BuLi, or any other $C_1$ to $C_8$ alkyl lithium, using diethyl ether as a first solvent to yield a first intermediate product; reacting the first intermediate product with a second solvent to yield a second intermediate product; reacting the second intermediate product with a platinum salt in the presence of a third solvent to make the platinum complex, wherein the platinum complex comprises a formula:

Formula I

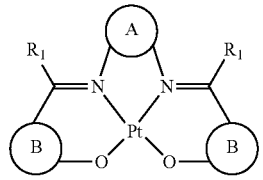

wherein A is selected from: an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene or an acyl-substituted heterocyclic arene,

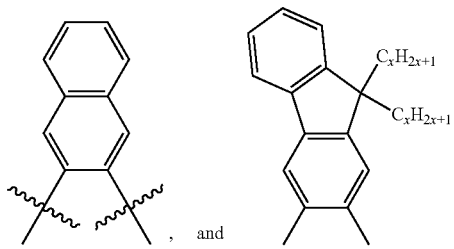

where x is 1 to 20;

wherein B is selected from a carbazole, alkyl N-substituted carbazole groups, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole and a acyl-substituted N-substituted carbazole group; and wherein $R_1$ is hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

FIG. 1 shows an embodiment for the method of making the platinum complex, which includes, Reaction 310, Reaction 320, Reaction 330, Reaction 340, Reaction 350, and Reaction 360. For example, Reaction 310 is implemented by provides for reacting the starting material (an organic compound) with n-BuLi using diethyl ether as a solvent at low temperature (−10° C.−−30° C.) for a sufficient reaction period followed by addition of Dimethylformamide ("DMF") at the same temperature. This yields Intermediate compound 410. Reaction 320 is implemented by reacting the starting material or Intermediate compound 410 or Intermediate compound 430 with aluminum trichloride or molten pyridine hydrogen chloride to yield Intermediate compounds 420, or 440, respectively. Reaction 330 can include, but is not limited to, reacting the starting material with n-BuLi using diethyl ether as solvent at relative high temperature (>−10° C.) for a sufficient reaction time followed by addition of DMF at the same temperature to yield Intermediate compound 430. Reaction 340 can include, but is not limited to, contacting an Intermediate compound 420 with paraformaldehyde in the presence of trimethylamine and magnesium chloride using acetonitrile as solvent giving Intermediate compound 440. Reaction 350 can include, but is not limited to, a condensation reaction using Intermediate compound 440 and yielding Intermediate compound 450. Reaction 360 can include but is not limited to, reacting Intermediate compound 450 with platinum salt in the presence of suitable solvent(s).

The apparatus can include, but is not limited to, a platinum complex of a formula:

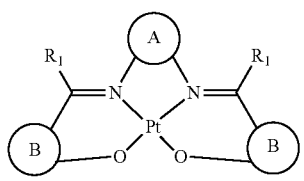

Formula I wherein A is selected from: an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene or an acyl-substituted heterocyclic arene,

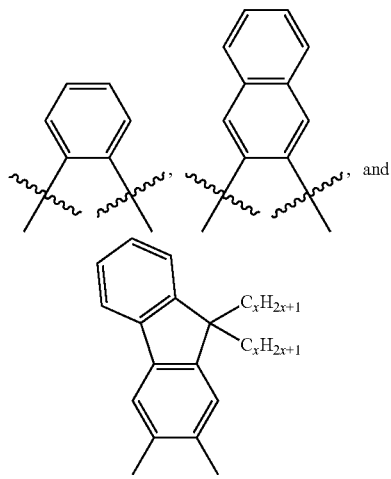

where x is 1 to 20;

wherein B is selected from a carbazole, alkyl N-substituted carbazole groups, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole and a acyl-substituted N-substituted carbazole group; and wherein $R_1$ is hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

The apparatus can include, but is not limited to, a light emitting apparatus, such as organic light emitting diode. The organic light-emitting diode can include, but is not limited to, is a single layer form including an integrated structure of an anode and a cathode, and a light-emitting layer containing the compound of Formula I as a light-emitting host material between the two electrodes, or a multilayer form including a charge transfer layer, an anode, a light-emitting layer containing the compound of Formula I as a light-emitting material, and a cathode stacked on each other in sequence. The platinum complex can be used as a dopant in a light-emitting layer in an organic light emitting diode.

Further, the organic light-emitting diode can include, but is not limited to: a first electrode, a second electrode, and one or more organic layers interposed between the first electrode and second electrode, the organic layer may include one or more organometallic compounds of Formula I.

Further, the organic light-emitting diode can include, but is not limited to: a multilayer diode composed of a combination of the light-emitting layer and charge transfer layer may present a more desirable property than the single layer diode composed of one light-emitting layer only. The light-emitting material attached or disposed on the charge transfer material to reduce the energy barrier when the charge is injected from the electrodes and balancing number density between the injected hole and electron due to the charge transfer layer confining the hole or electron injected from the electrodes in the light-emitting layer.

Further, the organic light-emitting diode can include, but is not limited to: a first electrode; a second electrode; and one or more organic layers interposed between the first electrode and the second electrode, wherein the organic layer comprises one or more organometallic compounds.

For example, the apparatus can be fabricated using the synthesis steps provided to yield Emitter 101 with a structure of ITO/PEDOT (40 nm)/PVK:PBD:Emitter 101 (80 nm)/CsF (1.5 nm)/Al (100 nm). In one embodiment, the NIR-OLED has a mixed host ratio of PVK:PBD of 100:40 and the Emitter 101 has doping concentration of about 1%, about 3%, or about 5%.

Figure 3:
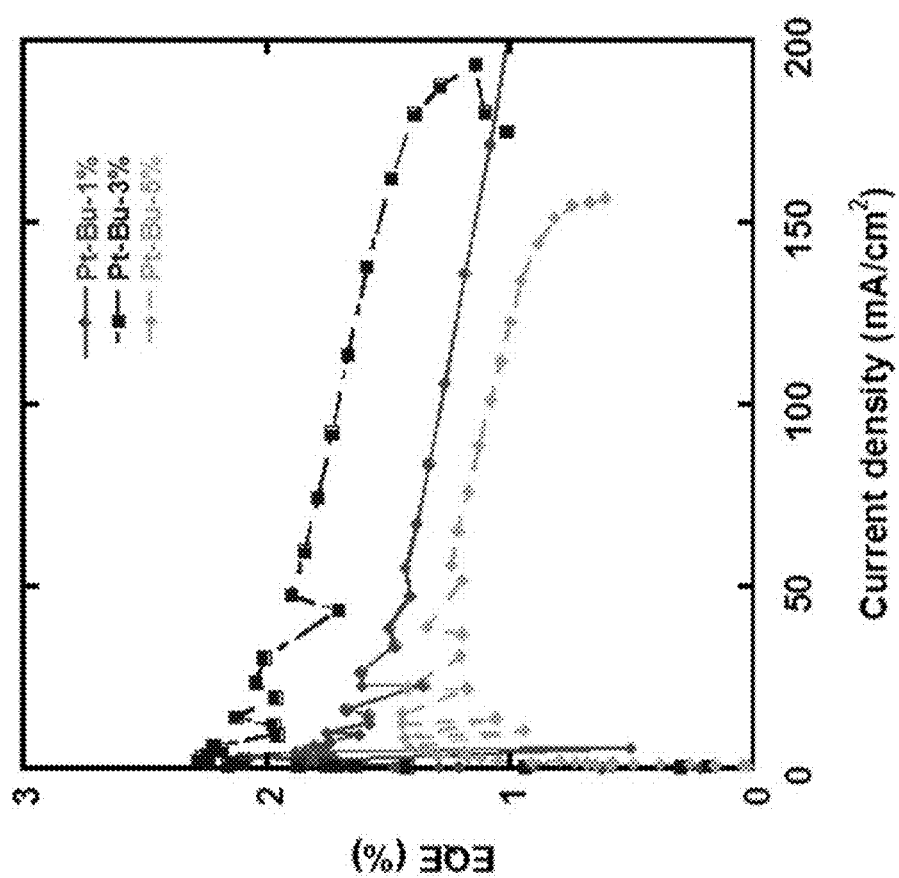
FIG. 3 shows the external quantum efficiency of an NIR OLEDs.

As shown in FIG. 3, the external quantum efficiency (EQE) of the NIR OLEDs at different current density of such a device is provided. As shown, the OLED manufactured with the platinum-based NIR emitters synthesized according to the provided steps and with doping concentration of 3% showed the best performance with a maximum EQE of 2.4%. The corresponding brightness was 0.02 mW cm$^{-2}$ and a current density of 12.5 mA cm$^{-2}$. In a further embodiment, the OLED manufactured is a platinum (II) NIR emitter synthesized according to the provided steps.

Materials and Methods

The examples and embodiments described herein are for illustrative purposes only and various modifications or changes in light thereof will be suggested to persons skilled in the art and are included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

Example 1 Synthetic Procedure of Intermediate Compound 421

By way of non-limiting detailed example, an alternative arrangement of steps described for synthesis of an intermediate compound 421 utilized in synthesis of platinum-based NIR emitters, such as a platinum(II) emitter is provided.

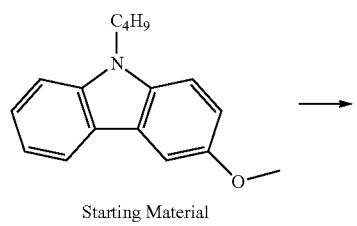

Starting Material

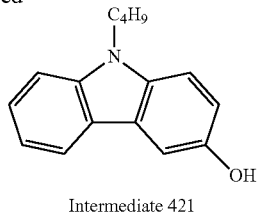

Intermediate 421

In the foregoing example, the steps of the reaction are carried out utilizing 2.1 g of starting material (8 mmol) that is dissolved in molten pyridine hydrochloride. Next, the mixture was stirred at 180° C. for at least several hours to overnight. The reaction mixture was diluted with water and extracted with dichloromethane. Then, the solvent was removed under reduced pressure and the crude product was purified by flash chromatography (EA:hex 1:9) which yielded the following results: Yield: 1.35 g (68%). $^1$H NMR (400 MHz, CDCl$_3$) δ 7.99 (d, J=7.8 Hz, 1H), 7.55 (d, J=2.3 Hz, 1H), 7.44 (t, J=7.8 Hz, 1H), 7.36 (d, J=8.2 Hz, 1H), 7.25 (d, J=8.7 Hz, 1H), 7.17 (t, J=7.4 Hz, 1H), 7.06 (dd, J=8.7, 2.4 Hz, 1H), 5.27-4.42 (s, br, 1H), 4.24 (t, J=7.1 Hz, 2H), 1.82 (pent, J=7.4 Hz, 2H), 1.38 (hex, J=7.5 Hz, 2H), 0.94 (t, J=7.2 Hz, 3H).

Example 2—Synthetic Procedure of Intermediate 441

By way of non-limiting detailed example, an alternative arrangement of steps described for synthesis of an alternative intermediate compound 441 is provided.

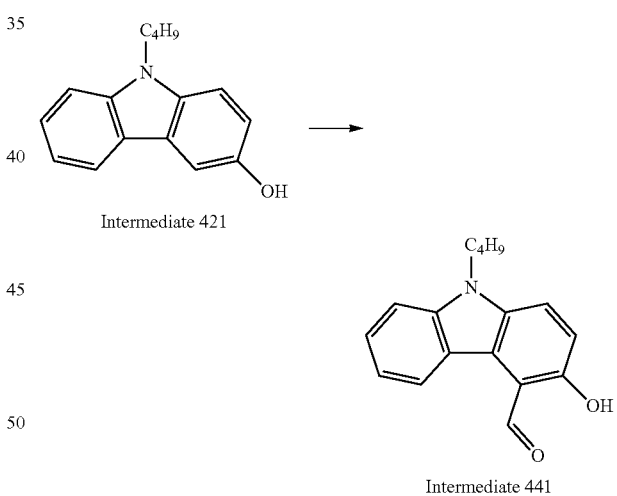

Intermediate 421

Intermediate 441

In the foregoing example, 1.35 g of Intermediate 421 (5.6 mmol) was dissolved in acetonitrile. Then 0.8 g of MgCl$_2$ (8.5 mmol, 1.5 equiv), 3 mL of trimethylamine (22 mmol, 3.8 equiv) and 1.24 g of paraformaldehyde (41 mmol, 7.3 equiv) were added to form a suspension. Next, the suspension was heated to reflux for at least several hours to overnight. Water was added to the suspension and then extracted with ethyl acetate. Then, the solvent was removed under reduced pressure. The crude product was purified using by flash chromatography (Et$_2$O:hex 1:19) yielding a yellow solid having the following characteristics: yield: 1.15 g (76%). $^1$H NMR (300 MHz, CDCl$_3$) δ 11.85 (s, 1H), 11.09 (s, 1H), 8.11 (d, J=8.1 Hz, 1H), 7.61 (d, J=9.0 Hz, 1H), 7.55-7.37 (m, 2H), 7.23 (t, J=8.1 Hz, 1H), 7.08 (d, J=9.0 Hz, 1H), 4.30 (t, J=7.2 Hz, 2H), 1.83 (pent, J=7.4 Hz, 2H), 1.38 (hex, J=7.5 Hz, 2H), 0.95 (t, J=7.3 Hz, 3H).

Example 3—Synthetic Procedure of Intermediate 411

By way of non-limiting detailed example, an alternative arrangement of steps described for synthesis of an intermediate compound 411 is provided.

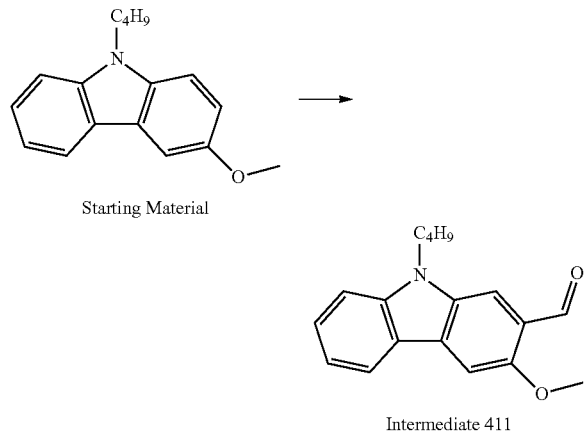

Starting Material

Intermediate 411

In the foregoing example, 2.56 g of Starting Material (10 mmol) was dissolved in dry $Et_2O$. 5 mL of 2.4M n-butyllithium (12 mmol, 1.2 equiv) was added dropwise at −78° C. The mixture was allow to warm to −10° C. and was stirred overnight. 1.2 mL of anhydrous DMF (15 mmol, 1.5 equiv) was added dropwise. The reaction mixture was stirred for further 5 hours at −10° C. and was stirred overnight at room temperature. 1 mL of conc. HCl was added and the mixture was stirred vigorously for 1 hr. Water was added and was extracted with $Et_2O$. Solvent was removed under reduced pressure and the crude was purified by flash chromatography ($Et_2O$:hex 1:19) to yield a yellow oil having the following characteristics: yield: 1.1 g (40%). $^1H$ NMR (300 MHz, $CDCl_3$) δ 10.62 (s, 1H), 8.08 (d, J=7.8 Hz, 1H), 7.92 (s, 1H), 7.61 (s, 1H), 7.52 (t, J=7.6 Hz, 1H), 7.39 (d, J=8.2 Hz, 1H), 7.22 (t, J=7.5 Hz, 1H), 4.30 (t, J=7.2 Hz, 2H), 4.06 (s, 3H), 1.83 (pent, J=7.4 Hz, 2H), 1.39 (hex, J=7.4 Hz, 2H), 0.94 (t, J=7.3 Hz, 3H).

Example 4—Synthetic Procedure of Intermediate 442

By way of non-limiting detailed example, an alternative arrangement of steps described for synthesis of an intermediate compound 442 is provided.

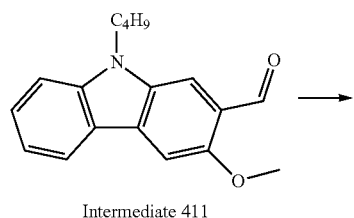

Intermediate 411

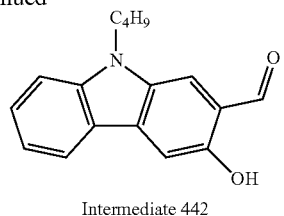

Intermediate 442

In the foregoing example, 1.1 g of Intermediate 411 (4 mmol) was dissolved in dichloromethane and 3.2 g of $AlCl_3$ (24 mmol, 6 equiv) was added portionwise. The mixture was stirred overnight at room temperature. The reaction was then quenched with ice. Organic layer was collected and solvent was removed under reduced pressure. The crude product was purified by flash chromatography ($Et_2O$:hex 1:19) to yield a yellow solid having the following characteristics: yield: 0.65 g (41%). 1H NMR (300 MHz, $CDCl_3$) δ 10.75 (s, 1H), 10.04 (s, 1H), 8.08 (d, J=7.7 Hz, 1H), 7.63 (s, 1H), 7.59-7.48 (m, 2H), 7.38 (d, J=8.3 Hz, 1H), 7.21 (t, J=7.5 Hz, 1H), 4.30 (t, J=7.1 Hz, 2H), 1.87 (pent, J=7.4 Hz, 2H), 1.50-1.34 (m, 2H), 0.97 (t, J=7.3 Hz, 3H).

Example 5—Synthetic Procedure of Intermediate 451

By way of non-limiting detailed example, an alternative arrangement of steps described for synthesis of an intermediate compound 451 according to the third reaction step of the synthesis process.

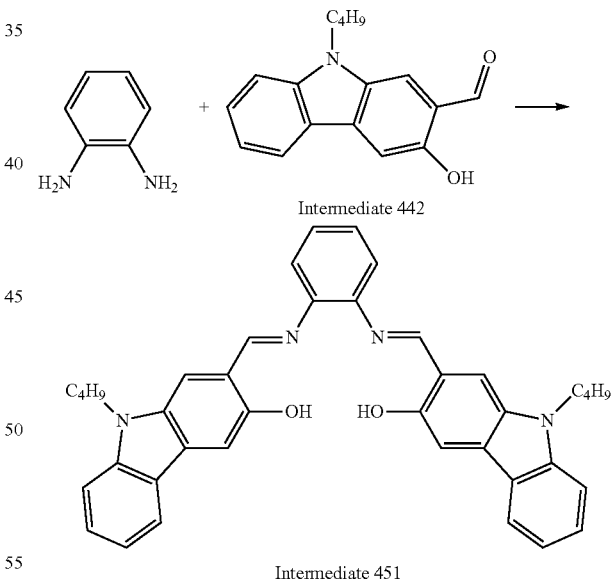

Intermediate 451

Here, 0.14 g of 1,2-phenylenediamine (1.3 mmol) and 0.7 g of Intermediate 442 (2.6 mmol, 2 equiv) were dissolved in hot ethanol. The mixture was heated to reflux for at least several hours to overnight and then cooled to 0° C. The yellow precipitate was collected via filtration and washed with cold ethanol. The Schiff Base ligand used directly for reaction without further purification has the following characteristics: Yield: 0.32 g (43%). $^1H$ NMR (400 MHz, $CDCl_3$) δ 12.74 (s, 2H), 8.83 (s, 2H), 8.04 (d, J=7.7 Hz, 2H), 7.69 (s, 2H), 7.47 (t, J=7.7 Hz, 2H), 7.38-7.28 (m, 8H), 7.17

(t, J=7.4 Hz, 2H), 4.24 (t, J=7.1 Hz, 4H), 1.83 (pent, J=7.4 Hz, 4H), 1.38 (hex, J=7.5 Hz, 4H), 0.94 (t, J=7.4 Hz, 6H).

Example 6—Synthetic Procedure of Intermediate 452

By way of non-limiting detailed example, an alternative arrangement of steps described for synthesis of an intermediate compound 452 according to the third reaction step of the synthesis process.

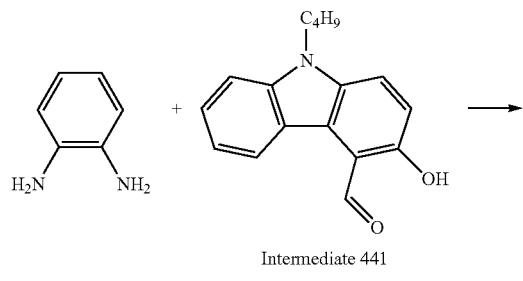

Intermediate 441

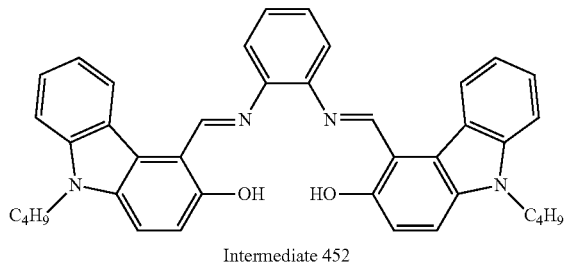

Intermediate 452

In the following example, 0.23 g of 1,2-phenylenediamine (2.1 mmol) and 1.12 g of Intermediate 441 (4.2 mmol, 2 equiv) were dissolved in minimum amount of hot ethanol. The mixture was heated to reflux for at least several hours to overnight and then cooled to 0° C. The yellow precipitate was collected via filtration and washed with cold ethanol. The Schiff Base ligand used directly for reaction without further purification has the following characteristics: yield: 0.74 g (57%). $^1$H NMR (300 MHz, CDCl$_3$) δ 13.71 (s, br), 9.87 (d, J=28.4 Hz, 2H), 8.15 (dd, J=14.8, 8.0 Hz, 2H), 7.59-7.34 (m, 8H), 7.23-7.09 (m, 4H), 6.94-6.80 (m, 2H), 4.49-4.13 (m, 4H), 1.94-1.77 (m, 4H), 1.44-1.28 (m, 4H), 0.95 (td, J=7.2, 2.8 Hz, 6H).

Example 7—Synthetic Procedure of Emitter 101

By way of non-limiting detailed example, a particular process for the synthesis of platinum-based NIR emitter from the intermediate compound according to the fourth reaction step is provided. In the following example the synthesis proceeds as:

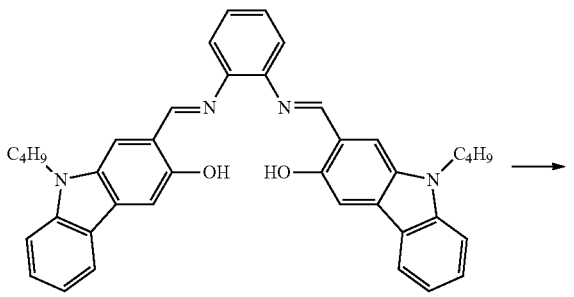

Intermediate 451

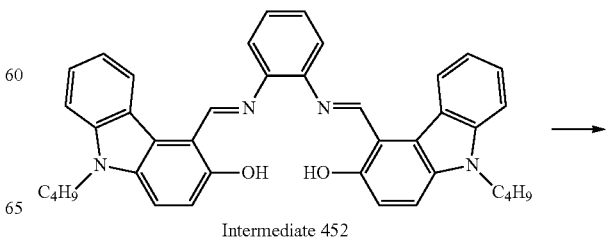

Emitter 101

Here, Intermediate compound 451 and sodium acetate (2 equiv) were dissolved in minimum amount of hot DMF. K$_2$PtCl$_4$ (1 equiv) was added in dropwise fashion for dissolution in minimum amount of hot DMSO. The resulting mixture was stirred at 80° C. for at least several hours to overnight. Water was then added and extracted with dichloromethane. Then, solvent was removed under reduced pressure. Next, the crude was washed with dichloromethane. The remaining impurities were removed by sublimation at 200° C. under vacuum yielding Emitter 101 as product which is a dark green solid and has the following characteristics: $^1$H NMR (400 MHz, DMSO) δ 9.73 (s, 2H), 8.54-8.37 (m, 2H), 8.17 (d, J=7.6 Hz, 2H), 8.00 (s, 2H), 7.81 (s, 2H), 7.55-7.40 (m, 6H), 7.12 (t, J=7.1 Hz, 2H), 4.27 (t, J=6.7 Hz, 4H), 1.86-1.75 (m, 4H), 1.42-1.30 (m, 4H), 0.92 (t, J=7.3 Hz, 6H). $^{13}$C NMR (151 MHz, DMSO) δ 180.14, 160.78, 153.08, 147.00, 145.87, 135.30, 133.75, 130.52, 129.66, 124.14, 123.03, 120.21, 118.62, 114.66, 111.22, 111.14, 44.35, 32.48, 22.00, 15.83.

Example 8—Synthetic Procedure of Emitter 102

By way of non-limiting detailed example, an particular processor for the synthesis of platinum-based NIR emitter from the intermediate compound according to the fourth reaction step is provided. In the following example the synthesis proceeds as:

Intermediate 452

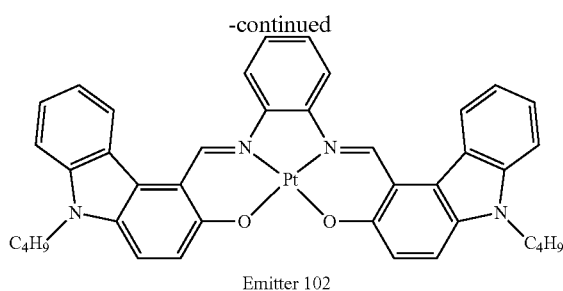

Emitter 102

Here, Intermediate 452 and sodium acetate (2 equiv) was dissolved in minimum amount of hot DMF. K$_2$PtCl$_4$ (1 equiv) was added in dropwise fashion for dissolution in a minimum amount of hot DMSO. The resulting mixture was stirred at 80° C. for at least several hours to overnight. Water was added and then extracted with dichloromethane. The solvent was removed under reduced pressure. Next, the crude was purified by flash chromatography (alumina column, DCM:hex 1:4). The product obtained was recrystallized in a DCM:hex mixture. Then, the remaining impurities are removed by sublimation at 200° C. under vacuum. These steps yield Emitter 102 as dark green solid which has the following characteristics: $^1$H NMR (400 MHz, CDCl$_3$) δ 10.05 (s, 2H), 8.17 (d, J=8.2 Hz, 2H), 8.11-8.01 (m, 2H), 7.65 (d, J=9.2 Hz, 2H), 7.56-7.48 (m, 2H), 7.46-7.36 (m, 6H), 7.33-7.27 (m, 2H), 4.24 (t, J=7.1 Hz, 4H), 1.84 (pent, J=7.4 Hz, 4H), 1.42 (hex, 4H), 0.98 (d, J=7.3 Hz, 6H).

Figure 2:
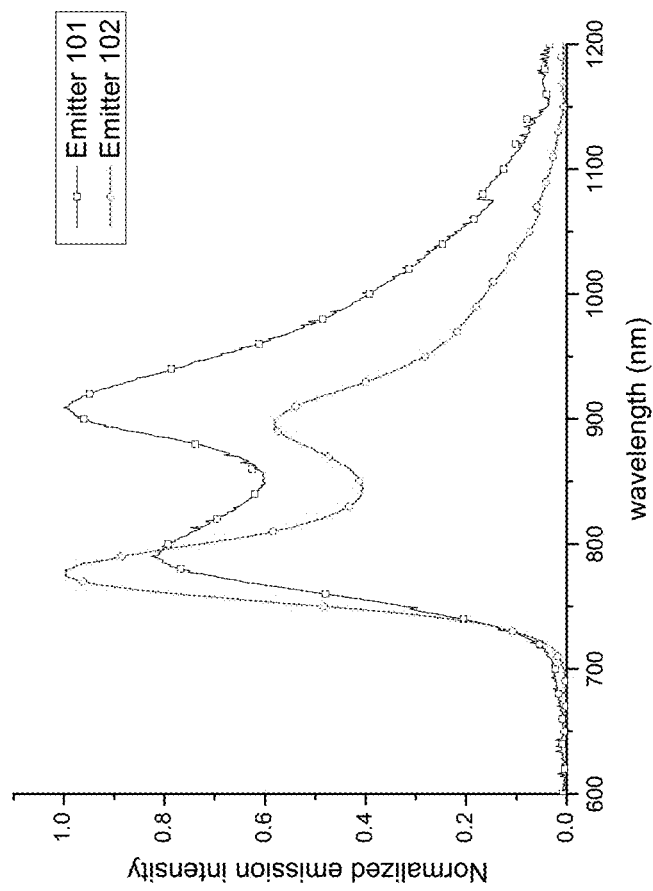
FIG. 2 shows the emission spectra and chemical structure of emitter 101 and 102 in dichloromethane solution.

The emission spectra of the emitters were measured and presented in Example 7 and Example 8. The results of the measurement are provided in FIG. 2. Based on the above, the properties of the emitters are summarized in Table 1 below.

TABLE 1

Photophysical data of emitters in dichloromethane solution.

| | $\lambda_{abs}$ [nm] (ε[dm$^3$ mol$^{-1}$ cm$^{-1}$]) | $\lambda_{em}$ [nm] | τ [μs] | k$_q$ [10$^7$ dm$^3$ mol$^{-1}$ s$^{-1}$] | $\Phi_{em}$ |
|---|---|---|---|---|---|
| Emitter 101 | 286 (37700), 338sh (13700), 363 (20500), 382 (21900), 408 (26200), 430 (37600), 459 (40600), 585sh (3200), 636 (5100) | 790, 909 | 1.2 | 3.3 | 0.05 |
| Emitter 102 | 261 (49100), 442 (38300), 448 (47800), 543 (10600), 583 (7300), 629 (8300) | 775, 898 | 1.4 | 17 | 0.03 |

The term "sh" denotes "shoulder", which is a description of a fine spectral feature of an absorption band.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility. It is therefore intended by the appended claims to cover any and all such applications, modifications and embodiments within the scope of the present invention.

As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising." The transitional terms/phrases (and any grammatical variations thereof) "comprising", "comprises", "comprise", "consisting essentially of", "consists essentially of", "consisting", and "consists" can be used interchangeably.

All patents, patent applications, provisional applications, and publications referred to or cited herein are incorporated by reference in their entirety, including all figures and tables, to the extent they are not inconsistent with the explicit teachings of this specification.

What is claimed is:

1. A platinum complex, wherein the platinum complex comprises a formula:

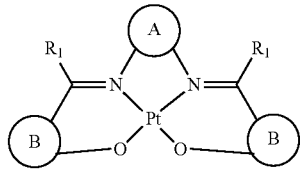

Formula I wherein A is selected from: an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene and an acyl-substituted heterocyclic arene,

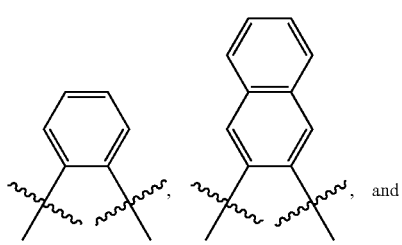

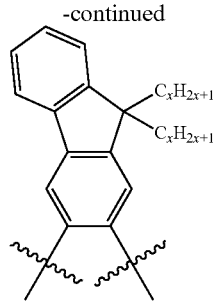

where x is 1 to 20;

wherein B is selected from: a carbazole, alkyl N-substituted carbazole groups, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole and acyl-substituted N-substituted carbazole; and wherein $R_1$ is selected from: a hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, and alkoxycarbonyl group.

2. The platinum complex of claim 1, wherein $R_1$ is hydrogen, halogen, hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thiol, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, and an alkoxycarbonyl group containing from 1 to 20 carbon atoms.

3. The platinum complex of claim 1, wherein the platinum complex is selected from:

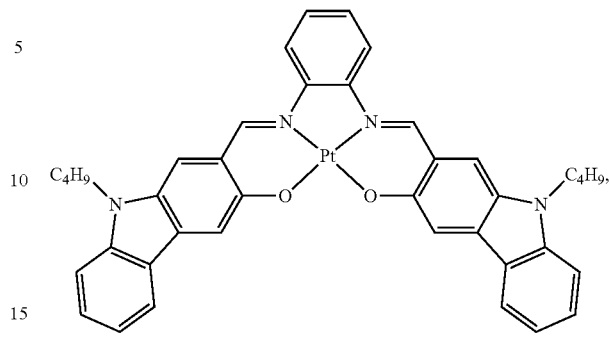

Emitter 101

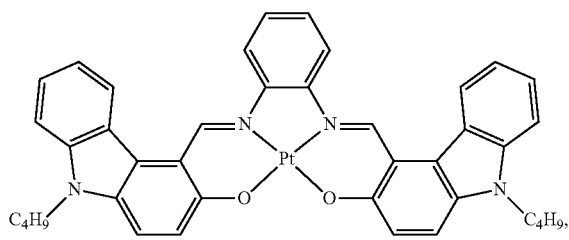

Emitter 102

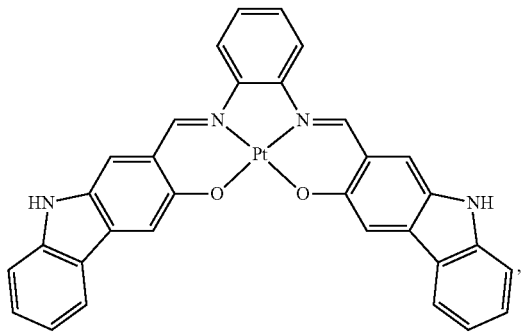

Emitter 103

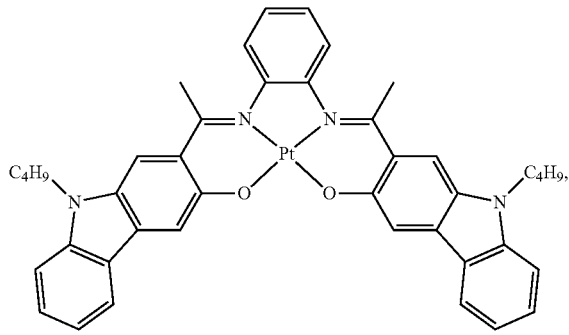

Emitter 104

Emitter 105
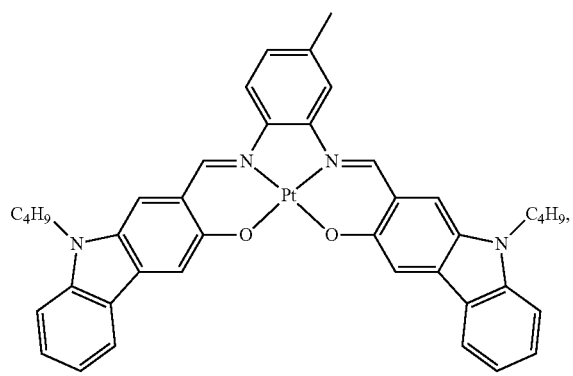
Emitter 106
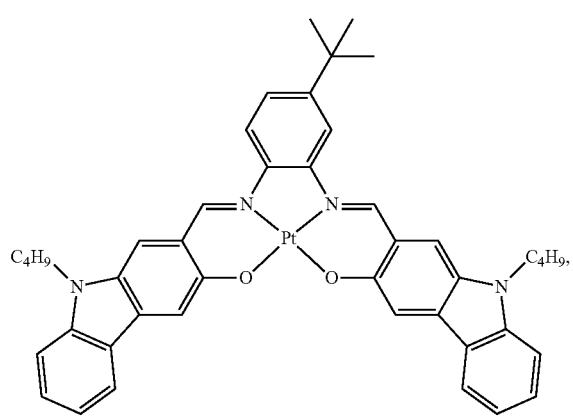
Emitter 107
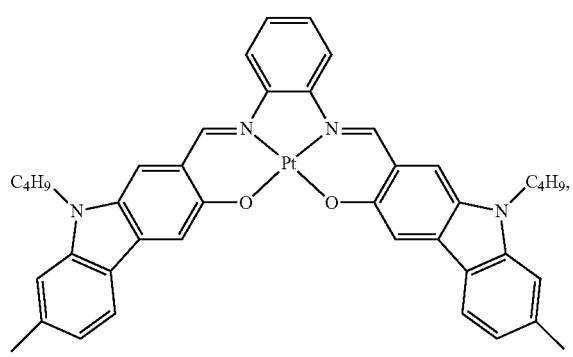
Emitter 108
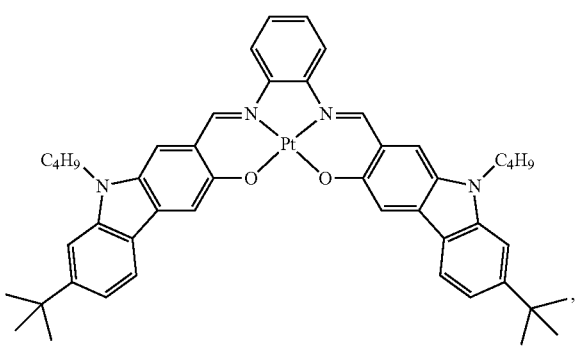
Emitter 109
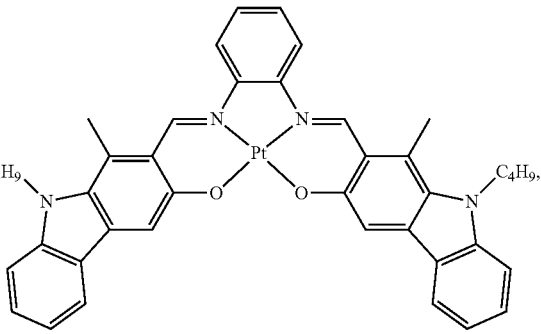
Emitter 110
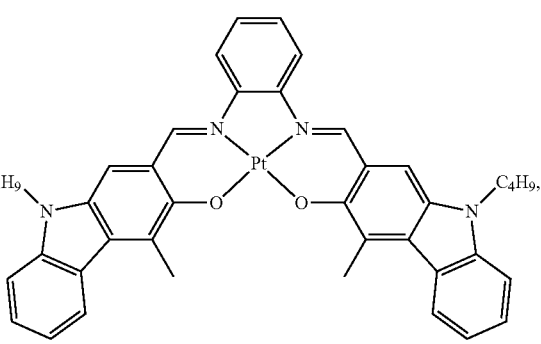
Emitter 111
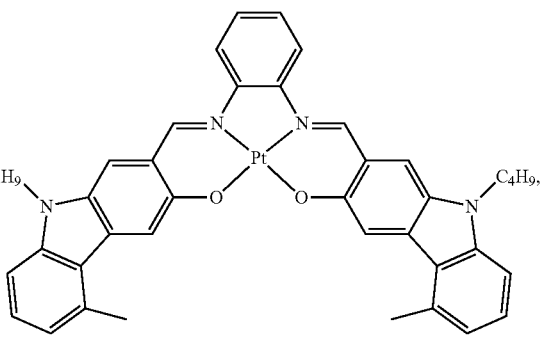
Emitter 112
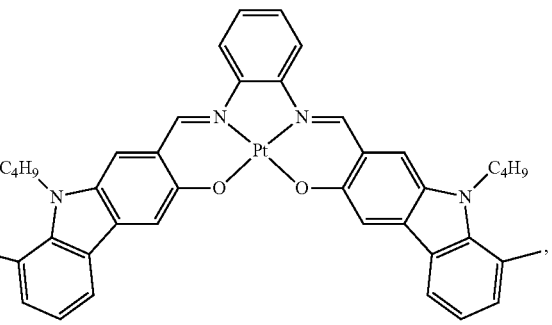

-continued
Emitter 113
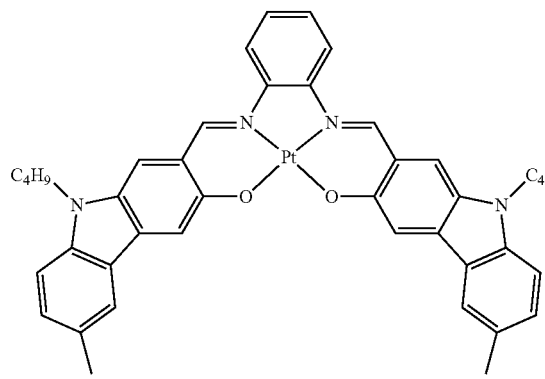
Emitter 114
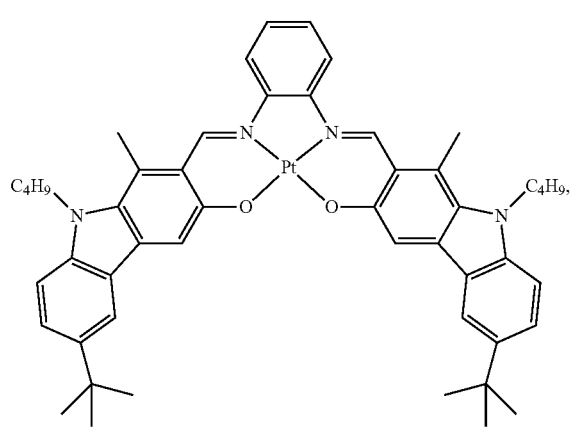
Emitter 115
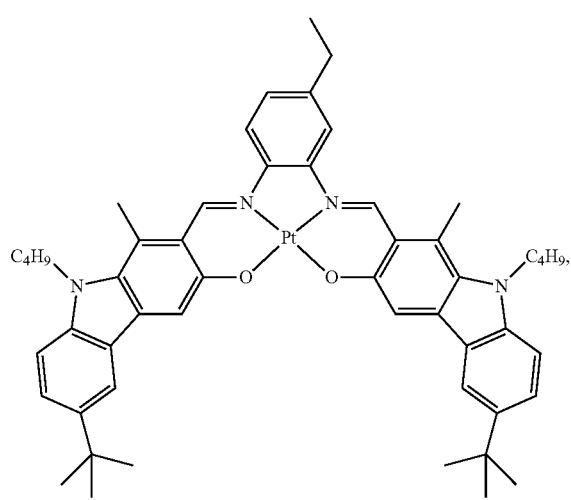
Emitter 116
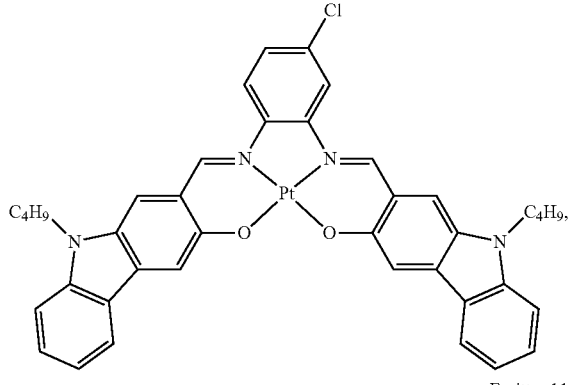
Emitter 117
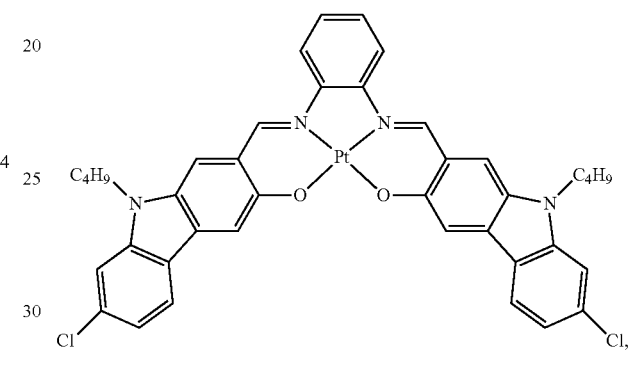
Emitter 118
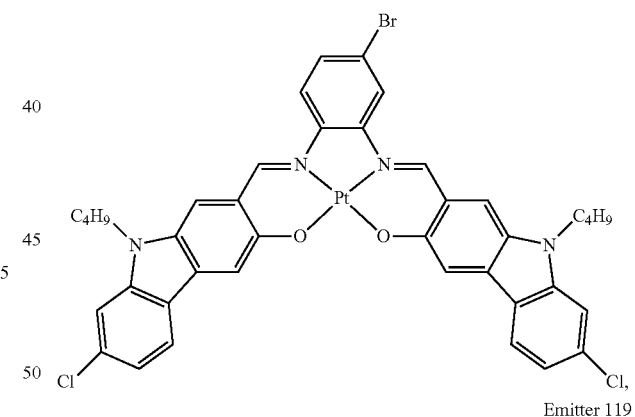
Emitter 119
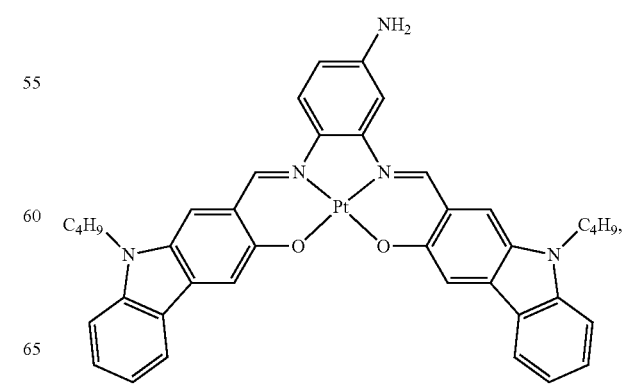

Emitter 120

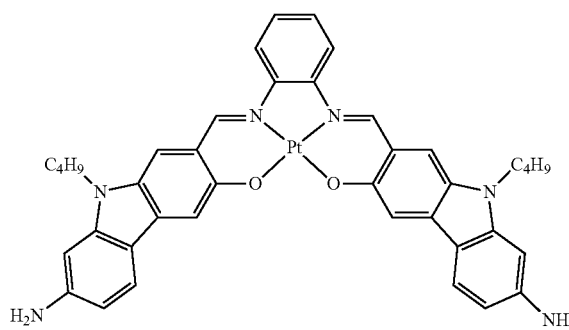

Emitter 121

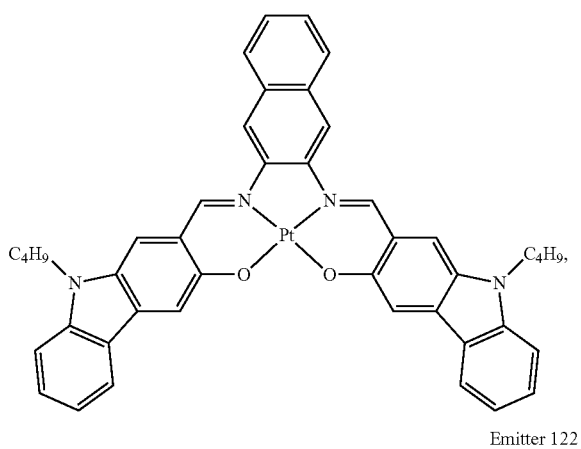

Emitter 122

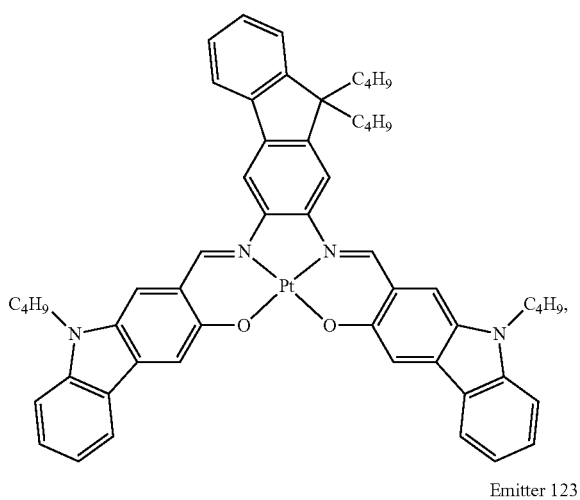

Emitter 123

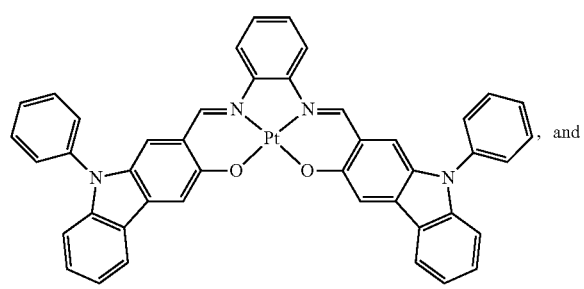, and

Emitter 124

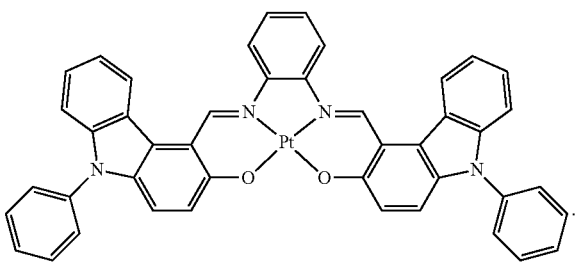.

4. The platinum complex of claim 1, wherein the platinum complex in solution has an emission peak of greater than about 775 nm.

5. An apparatus, wherein the apparatus comprises a platinum complex of a formula:

Formula I

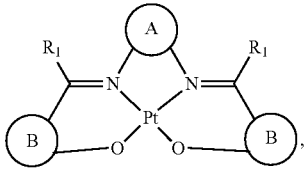, wherein A is selected from: an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene or an acyl-substituted heterocyclic arene,

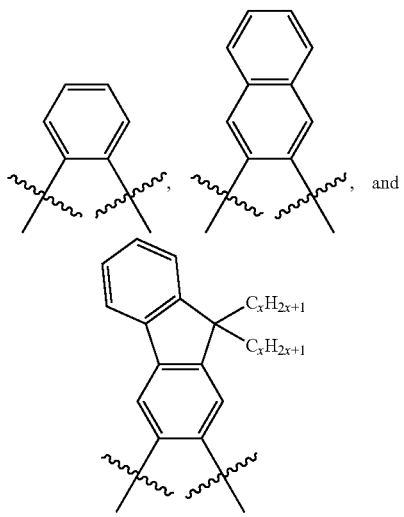

where x is 1 to 20;
wherein B is selected from a carbazole, alkyl N-substituted carbazole groups, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole and a acyl-substituted N-substituted carbazole group; and wherein $R_1$ is hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

6. The apparatus of claim 5, wherein $R_1$ is selected from a hydrogen, halogen, hydroxyl, unsubstituted alkyl containing from 1 to 10 carbon atoms, substituted alkyl containing from 1 to 20 carbon atoms, cycloalkyl containing from 4 to 20 carbon atoms, unsubstituted aryl containing from 6 to 20 carbon atoms, substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thiol, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, and alkoxycarbonyl group containing from 1 to 20 carbon atoms.

7. The apparatus of claim 5, wherein the platinum complex is selected from:

Emitter 101

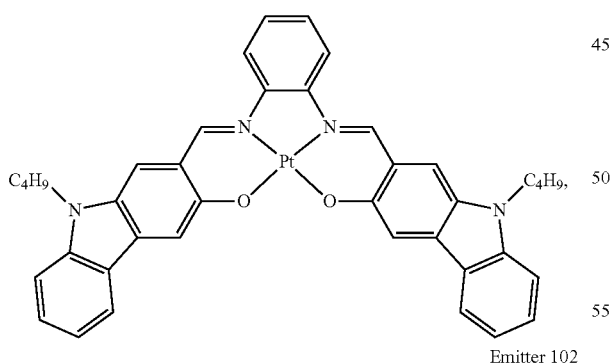

Emitter 102

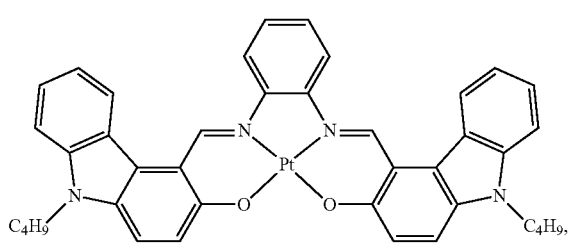

Emitter 103

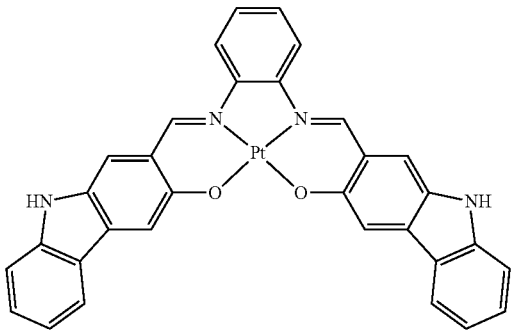

Emitter 104

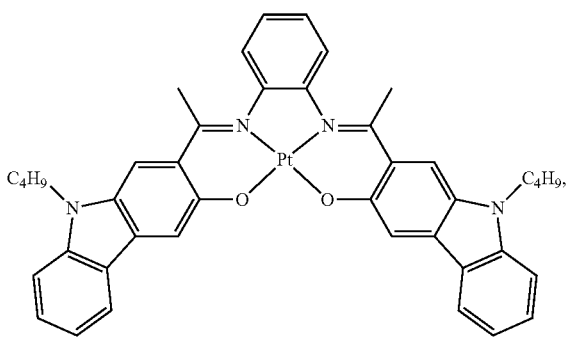

Emitter 105

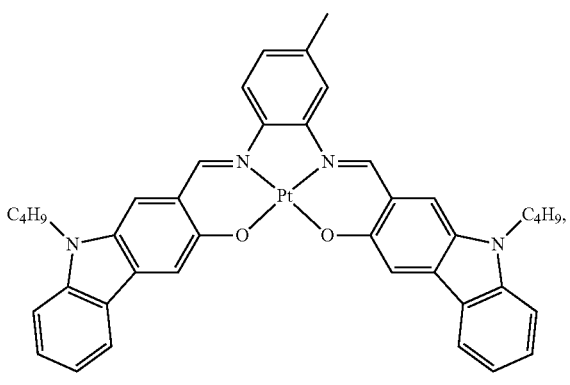

Emitter 106

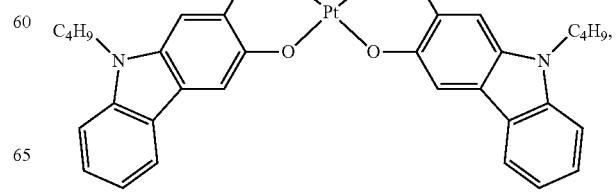

Emitter 107
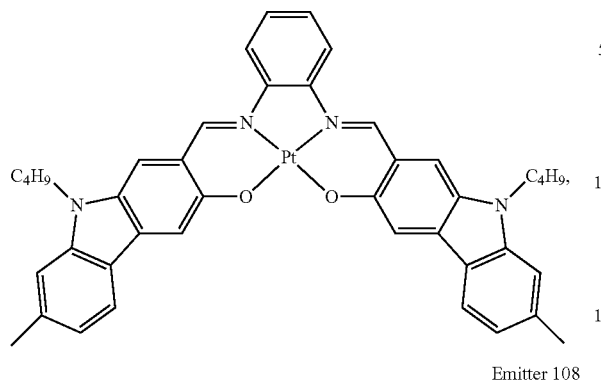
Emitter 108
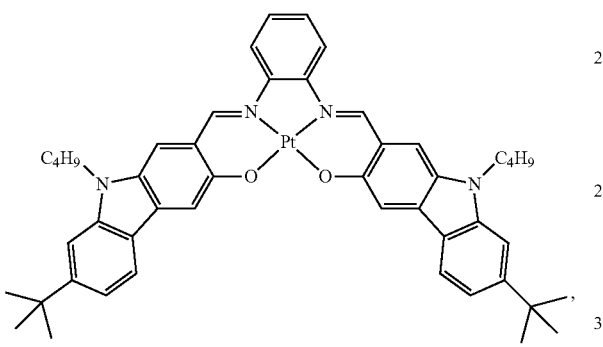
Emitter 109
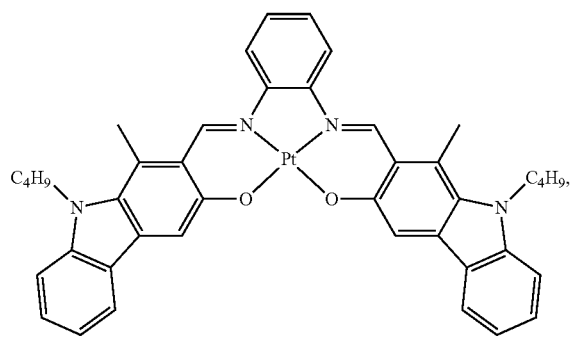
Emitter 110
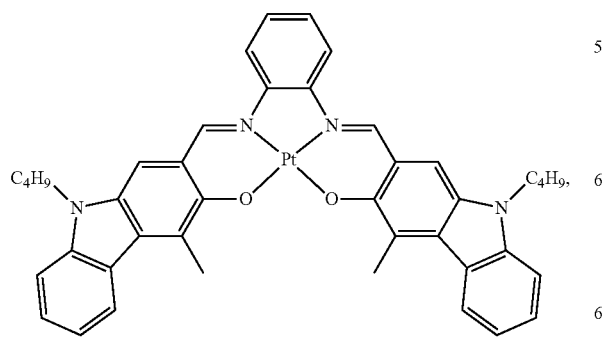
Emitter 111
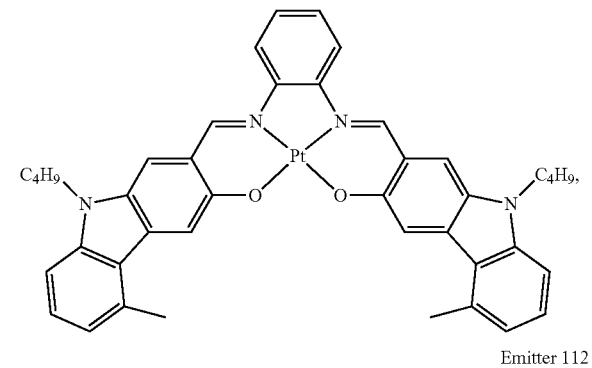
Emitter 112
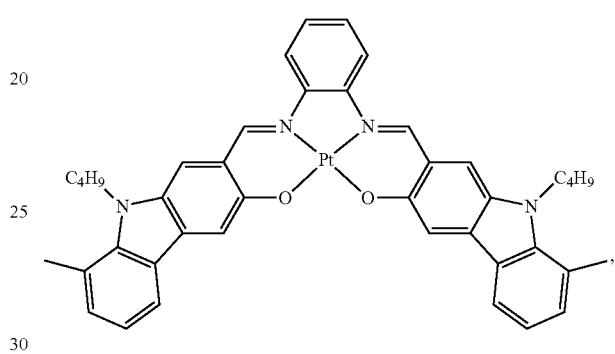
Emitter 113
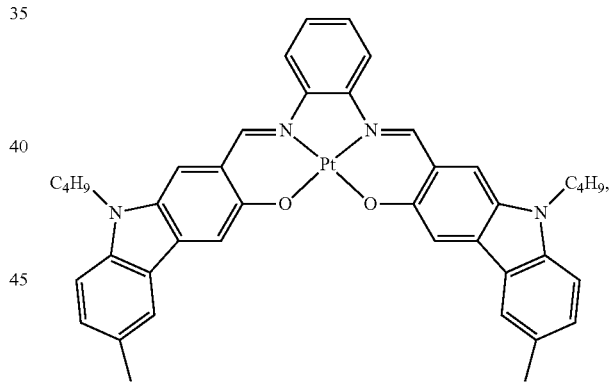
Emitter 114
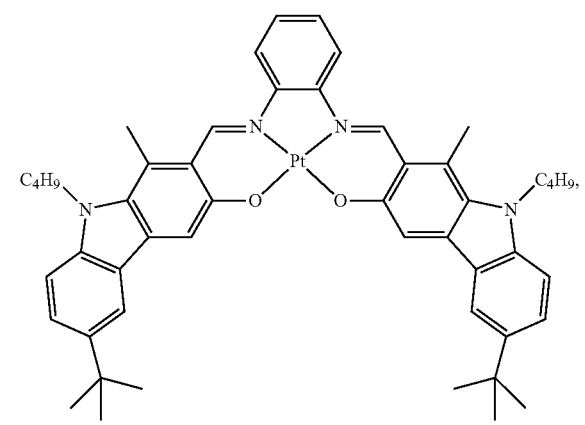

Emitter 115
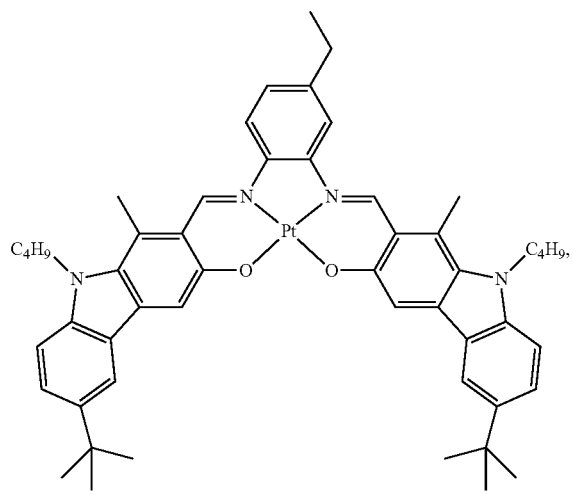
Emitter 116
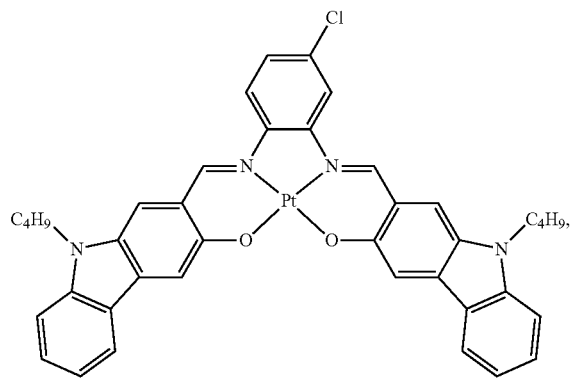
Emitter 117
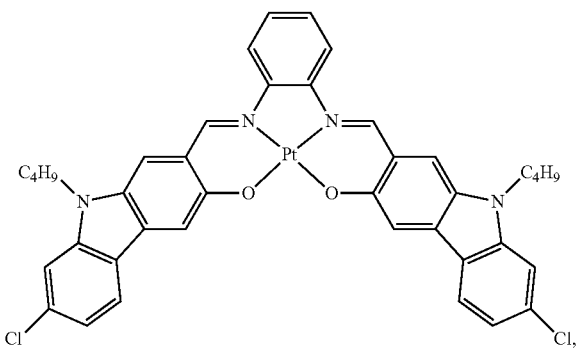
Emitter 118
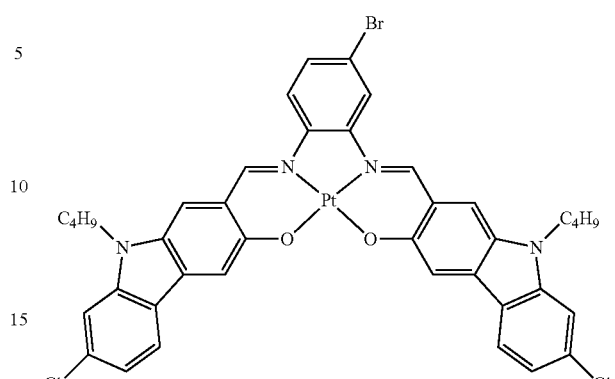
Emitter 119
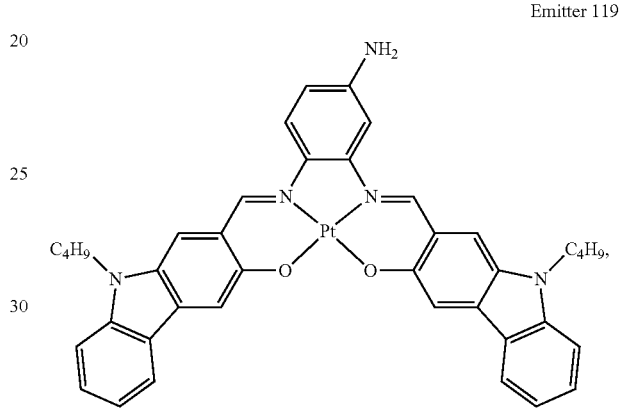
Emitter 120
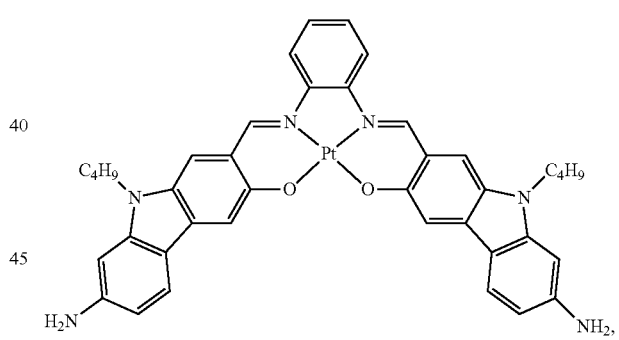
Emitter 121
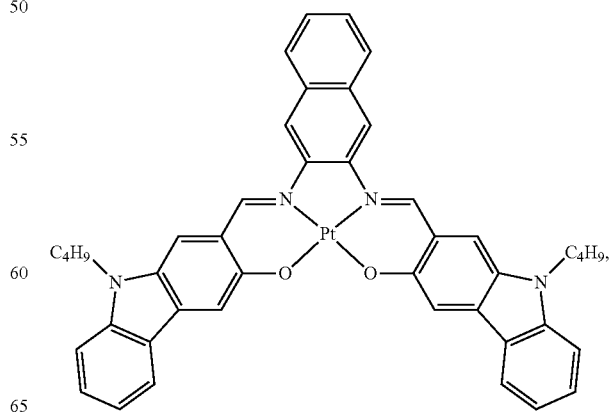

-continued

Emitter 122

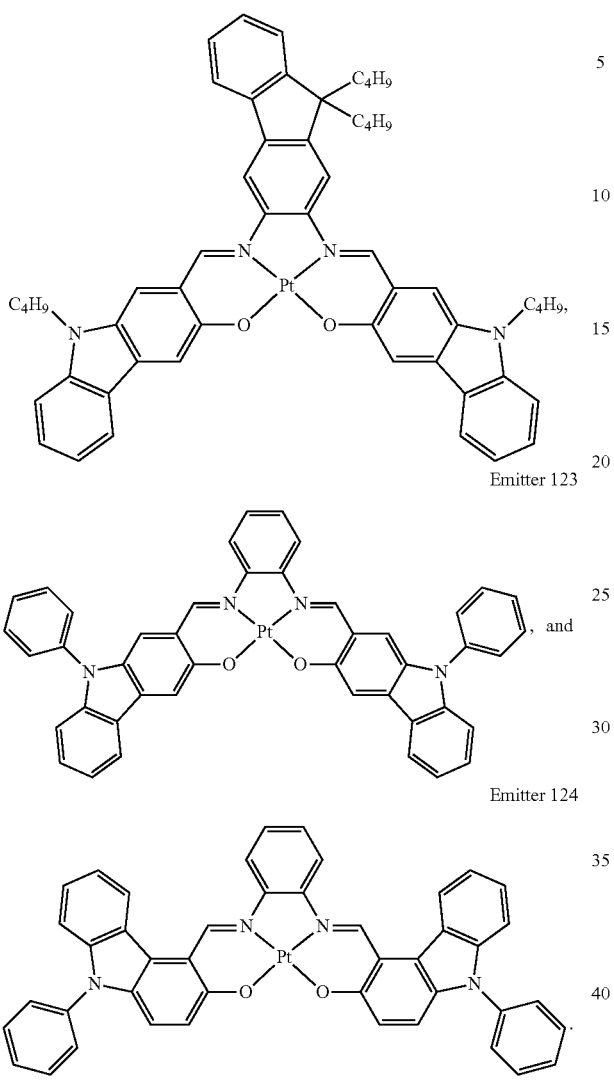

Emitter 123

Emitter 124

8. The apparatus of claim 5, wherein the apparatus further comprises one emissive layer.

9. The apparatus of claim 5, wherein the apparatus further comprises more than one emissive layer.

10. The apparatus of claim 8, wherein the platinum complex is a dopant of the emissive layer.

11. The apparatus of claim 5, wherein the apparatus is an organic light-emitting diode.

12. The apparatus of claim 11, wherein the apparatus further comprises a first electrode, a second electrode, one or more organic layers interposed between the first electrode and the second electrode, and wherein the organic layer comprises the platinum complex.

13. A method of making a platinum complex, the method comprising:
reacting a starting material with n-BuLi using diethyl ether as a first solvent to yield a first intermediate product;
reacting the first intermediate product with a second solvent to yield a second intermediate product; and
reacting the second intermediate product with a platinum salt in the presence of a third solvent to make the platinum complex, wherein the platinum complex comprises a formula:

Formula I

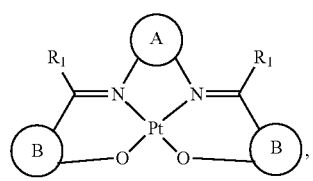

wherein A is selected from: an arene, heterocyclic arene, alkyl substituted arene, alkoxy-substituted arene, halogen substituted arene, nitro-substituted arene, cyano-substituted arene, amino-substituted arene, hydroxyl-substituted arene, alkylamino-substituted arene, acyl-substituted arene, alkyl substituted heterocyclic arene, alkoxy-substituted heterocyclic arene, halogen substituted heterocyclic arene, nitro-substituted heterocyclic arene, cyano-substituted heterocyclic arene, amino-substituted heterocyclic arene, hydroxyl-substituted heterocyclic arene, alkylamino-substituted heterocyclic arene or an acyl-substituted heterocyclic arene,

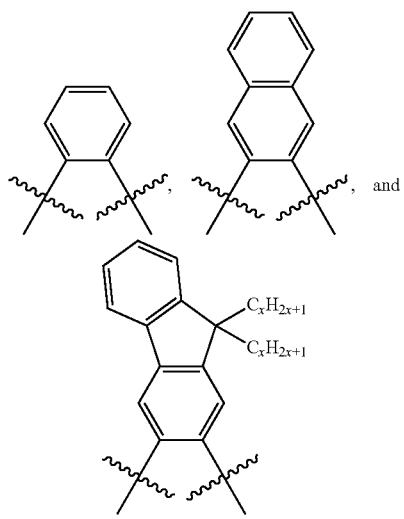

where x is 1 to 20;
wherein B is selected from a carbazole, alkyl N-substituted carbazole groups, alkyl substituted carbazole, alkoxy-substituted carbazole, halogen substituted carbazole, nitro-substituted carbazole, cyano-substituted carbazole, amino-substituted carbazole, hydroxyl-substituted carbazole, alkylamino-substituted carbazole, acyl-substituted carbazole, alkyl substituted N-substituted carbazole, alkoxy-substituted N-substituted carbazole, halogen substituted N-substituted carbazole, nitro-substituted N-substituted carbazole, cyano-substituted N-substituted carbazole, amino-substituted N-substituted carbazole, hydroxyl-substituted N-substituted carbazole, alkylamino-substituted N-substituted carbazole and a acyl-substituted N-substituted carbazole group; and
wherein $R_1$ is hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group.

* * * * *